(12) United States Patent
Sekine et al.

(10) Patent No.: US 8,598,561 B2
(45) Date of Patent: Dec. 3, 2013

(54) NONVOLATILE MEMORY DEVICE AND METHOD FOR MANUFACTURING SAME

(75) Inventors: Katsuyuki Sekine, Mie-ken (JP); Ryota Fujitsuka, Mie-ken (JP); Yoshio Ozawa, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 324 days.

(21) Appl. No.: 13/004,287

(22) Filed: Jan. 11, 2011

(65) Prior Publication Data

US 2011/0175048 A1 Jul. 21, 2011

(30) Foreign Application Priority Data

Jan. 18, 2010 (JP) ................................. 2010-008137

(51) Int. Cl.
*H01L 29/06* (2006.01)
(52) U.S. Cl.
USPC ..... 257/4; 257/2; 257/3; 257/5; 257/E29.002; 257/E29.112
(58) Field of Classification Search
USPC ............ 257/2–5, E29.002, E29.112; 365/148
See application file for complete search history.

(56) References Cited

U.S. PATENT DOCUMENTS

| 6,933,516 | B2* | 8/2005 | Xu ...................................... 257/4 |
| 7,696,507 | B2* | 4/2010 | Khang et al. ....................... 257/4 |
| 7,772,581 | B2* | 8/2010 | Lung .................................. 257/3 |
| 7,777,214 | B2* | 8/2010 | Shin et al. .......................... 257/2 |
| 8,039,829 | B2* | 10/2011 | Park et al. ......................... 257/4 |
| 2006/0098524 | A1* | 5/2006 | Xu et al. ......................... 365/232 |
| 2009/0321711 | A1* | 12/2009 | Takagi et al. ..................... 257/5 |
| 2010/0288995 | A1 | 11/2010 | Ozawa et al. |

FOREIGN PATENT DOCUMENTS

JP 4166820 8/2008

OTHER PUBLICATIONS

U.S. Appl. No. 12/884,000, filed Sep. 16, 2010, Takano.

* cited by examiner

*Primary Examiner* — Allison P Bernstein
(74) *Attorney, Agent, or Firm* — Oblon, Spivak, McClelland, Maier & Neustadt, L.L.P.

(57) ABSTRACT

A nonvolatile memory device includes first and second conductive layers, a resistance change layer, and a rectifying element. The first conductive layer has first and second major surfaces. The second conductive layer has third and fourth major surfaces, a side face, and a corner part. The third major surface faces the first major surface and includes a plane parallel to the first major surface and is provided between the fourth and first major surfaces. The corner part is provided between the third major surface and the side face and has a curvature higher than that of the third major surface. The resistance change layer is provided between the first and second conductive layers. The rectifying element faces the second major surface of the first conductive layer. An area of the third major surface is smaller than that of the second major surface.

17 Claims, 18 Drawing Sheets

FIG. 2A
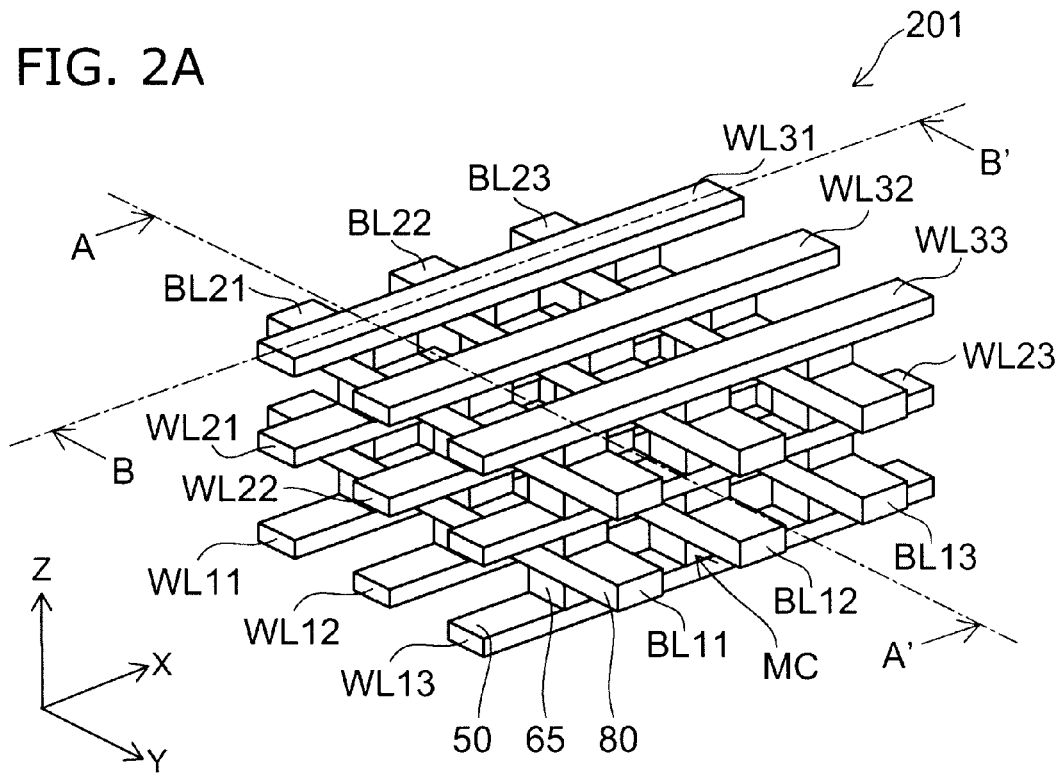
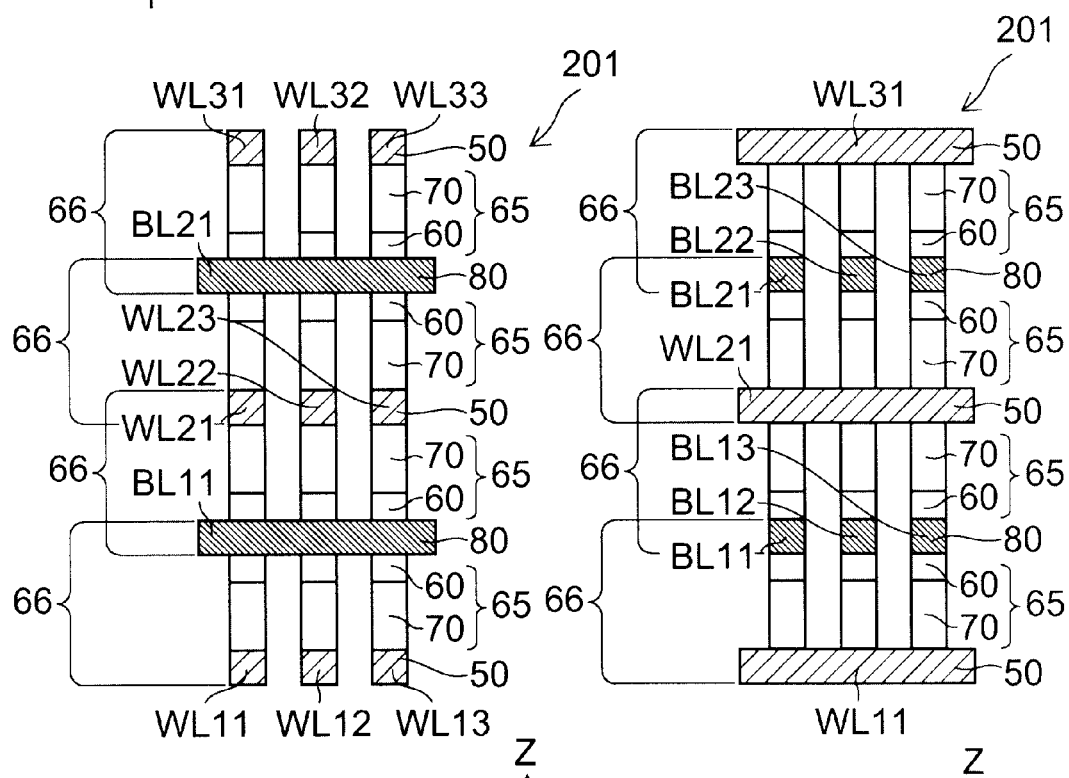
FIG. 2B
FIG. 2C

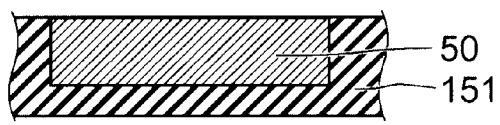
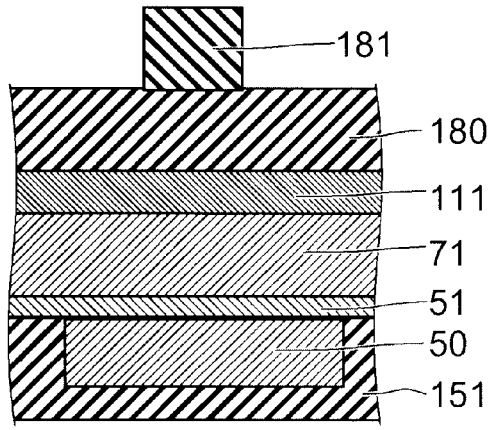
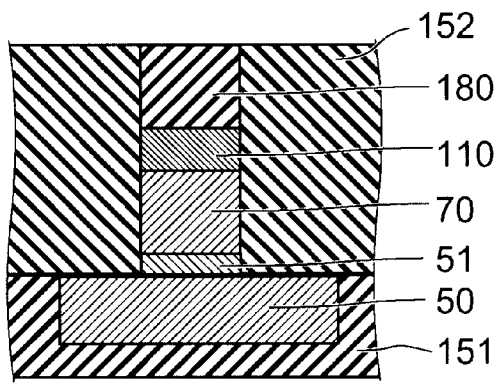
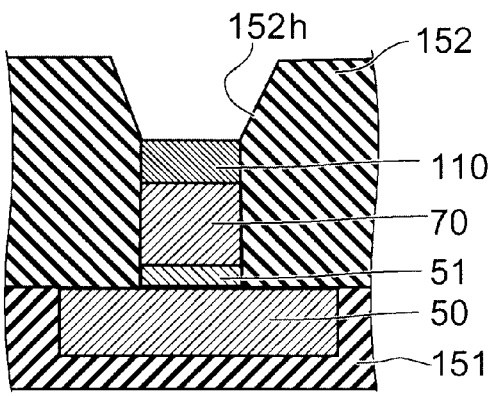
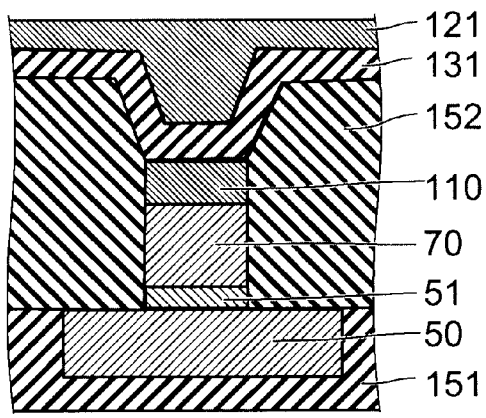
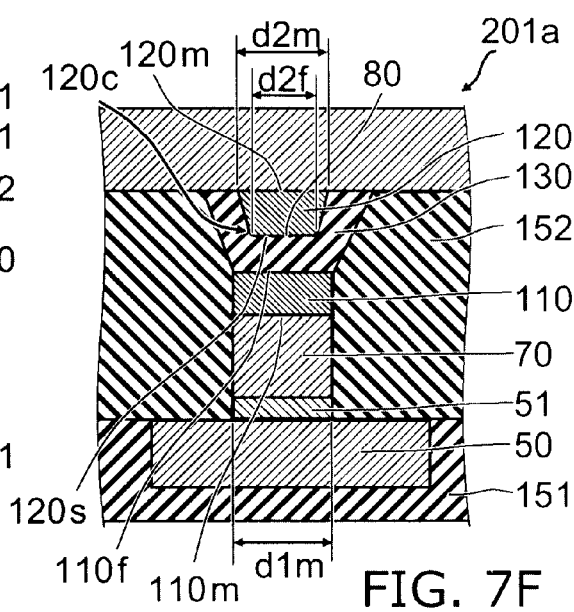

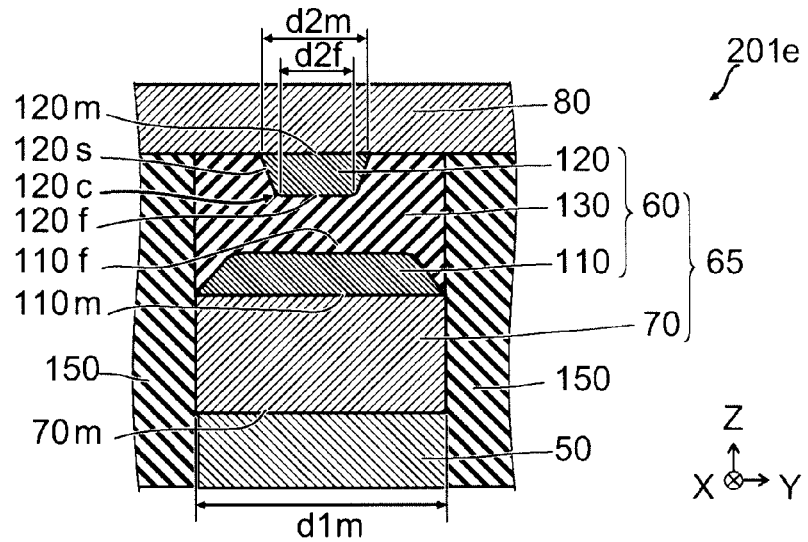
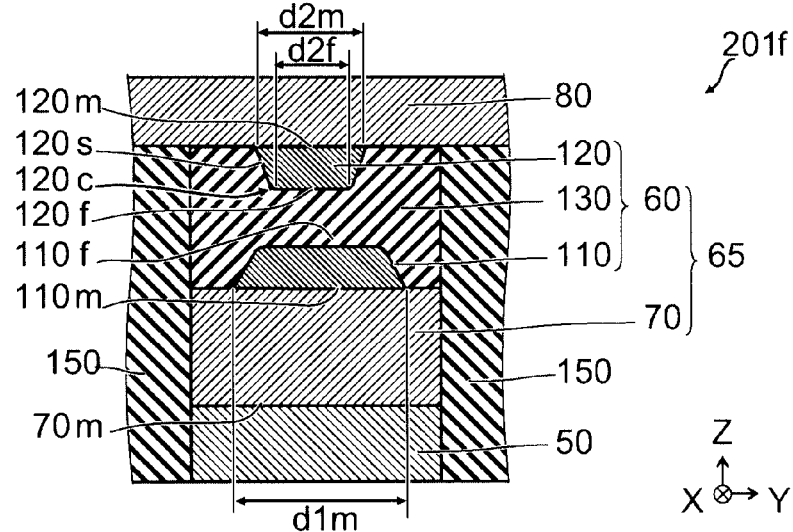
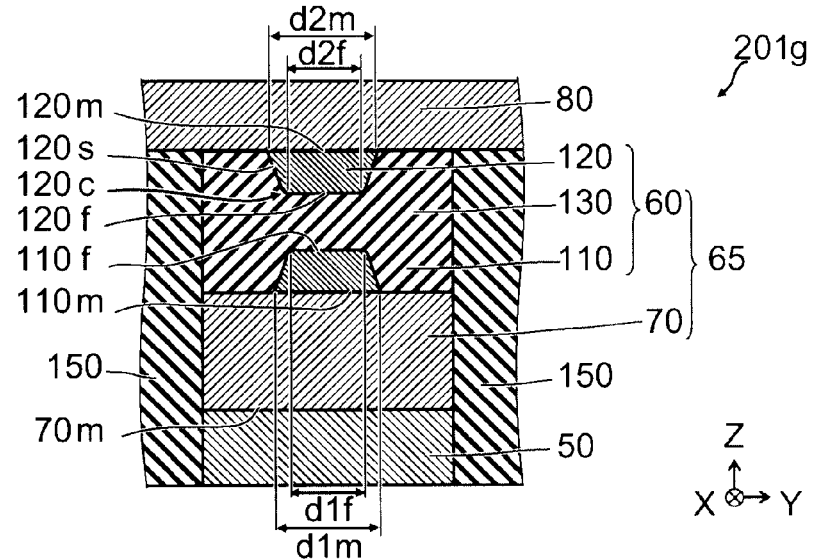

NONVOLATILE MEMORY DEVICE AND METHOD FOR MANUFACTURING SAME

CROSS-REFERENCE TO RELATED APPLICATIONS

This application is based upon and claims the benefit of priority from the prior Japanese Patent Application No. 2010-008137, filed on Jan. 18, 2010; the entire contents of which are incorporated herein by reference.

FIELD

Embodiments described herein relate generally to a nonvolatile memory device and a method for manufacturing the same.

BACKGROUND

In a resistance change type memory, the characteristic is not deteriorated easily even when downscaled, and it is easy to increase the storage capacity. Therefore, the resistance change type memory attracts attention as a next generation nonvolatile memory. In the resistance change type memory, characteristics in which the resistance of a resistance change film is changed by applying a voltage to the resistance change film and passing a current to the resistance change film are used.

In Japanese Patent No. 416682, a configuration is proposed in which the thickness of an upper electrode on a resistance change layer is increased continuously from the periphery part to the central part and the contact surface between the upper electrode and the resistance change layer is formed in convex like toward a substrate side to make a bowl-like shape, in order to recover a failure of the operation.

However, there is room for improvement in stabilization of operation.

BRIEF DESCRIPTION OF THE DRAWINGS

FIG. 2A to FIG. 2C are schematic views illustrating the configuration of the nonvolatile memory device according to the first embodiment;

FIG. 7A to FIG. 7F are schematic cross-sectional views of processes, illustrating a method for manufacturing another nonvolatile memory device according to the first embodiment;

FIG. 9A to FIG. 9C are schematic cross-sectional views illustrating the configurations of other nonvolatile memory devices according to the first embodiment;

DETAILED DESCRIPTION

Figure 1:
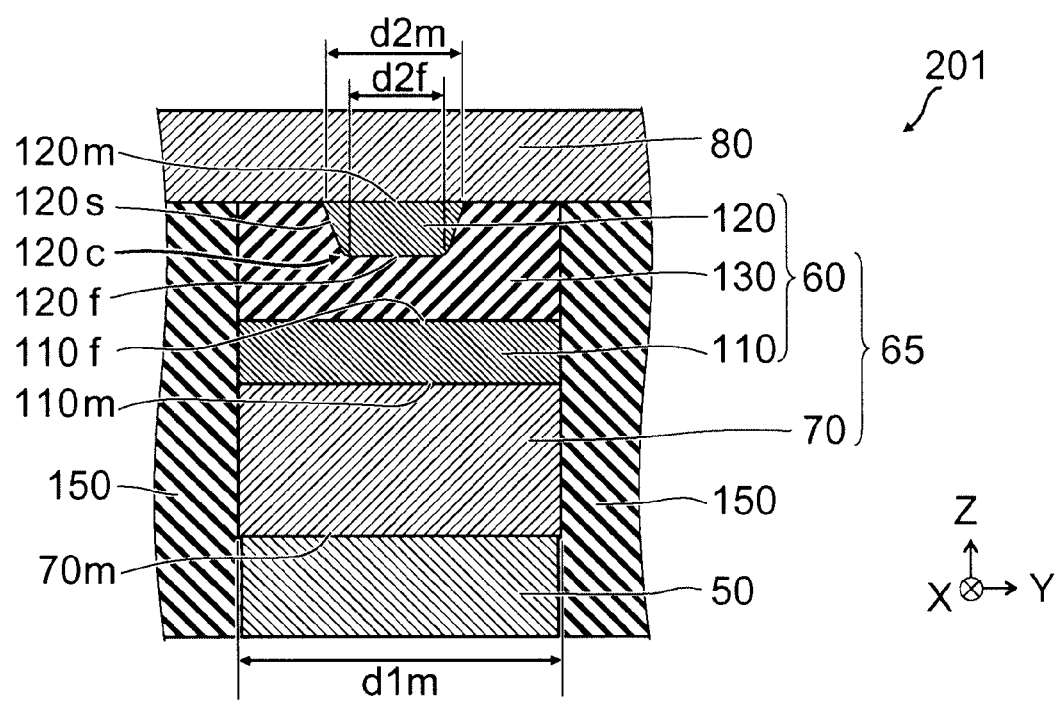
FIG. 1 is a schematic cross-sectional view illustrating the configuration of a nonvolatile memory device according to a first embodiment.

In general, according to one embodiment, a nonvolatile memory device includes a first conductive layer, a second conductive layer, a resistance change layer, and a rectifying element. The first conductive layer has a first major surface and a second major surface on a side opposite to the first major surface. The second conductive layer has a third major surface, a fourth major surface, a side face, and a corner part. The third major surface faces the first major surface and includes a plane parallel to the first major face. The third major surface is provided between the fourth major surface and the first major surface. The side face is connected with the third major surface and the fourth major surface. The corner part is provided between the third major surface and the side face. The corner part has a curvature higher than a curvature of the third major surface. The resistance change layer is provided between the first conductive layer and the second conductive layer. A resistance of the resistance change layer is configured to change by at least one of an electric field applied to the resistance change layer and a current applied to the resistance change layer. The rectifying element is provided to face the second major surface of the first conductive layer. An area of the third major surface is smaller than an area of the second major surface.

Embodiments will now be described with reference to the drawings.

The drawings are schematic or conceptual; and the relationships between the thickness and width of portions, the proportional coefficients of sizes among portions, etc., are not necessarily the same as the actual values thereof. Further, the dimensions and proportional coefficients may be illustrated differently among the drawings, even for identical portions.

In the specification and the drawings of the application, components similar to those described in regard to a drawing thereinabove are marked with like reference numerals, and a detailed description is omitted as appropriate.

First Embodiment

FIG. 1 is a schematic cross-sectional view illustrating the configuration of a nonvolatile memory device according to a first embodiment.

FIG. 2A to FIG. 2C are schematic views illustrating the configuration of the nonvolatile memory device according to the first embodiment.

Figure 3:
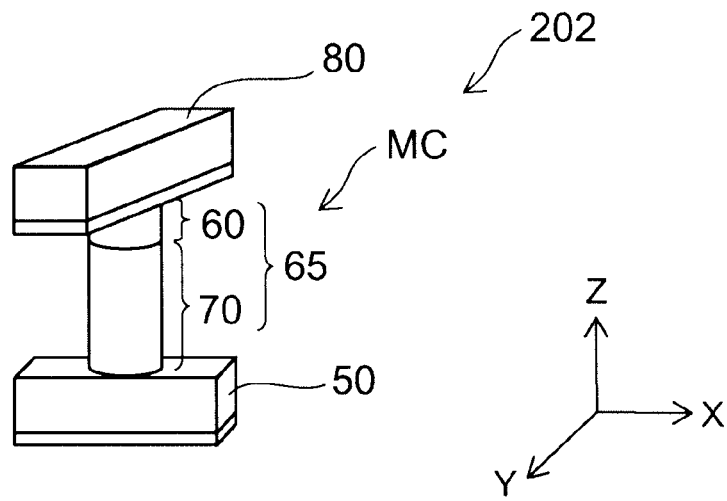
FIG. 3 is a schematic view illustrating the configuration of a nonvolatile memory device according to the first embodiment.

FIG. 3 is a schematic view illustrating the configuration of the nonvolatile memory device according to the first embodiment.

Namely, FIG. 2A is a schematic perspective view, FIG. 2B is a cross-sectional view along line A-A' of FIG. 2A, and FIG. 2C is a cross-sectional view along line B-B' of FIG. 2A.

FIG. 1 is a cross-sectional view corresponding to a part of line A-A' of FIG. 2A. FIG. 3 is a schematic perspective view illustrating one portion of a memory cell MC illustrated in FIG. 2A.

A nonvolatile memory device according to this embodiment is an example of a crossing-point type nonvolatile memory device. The outline of the whole configuration of the crossing-point type nonvolatile memory device will now be described with reference to FIGS. 2A to 2C and FIG. 3.

As illustrated in FIGS. 2A to 2C, the nonvolatile memory device 201 has multiply-stacked element memory layers 66.

Each of the element memory layers 66 has a first interconnect 50, a second interconnect 80 provided non-parallel to the first interconnect 50, and a stacked structure body 65 provided between the first interconnect 50 and the second interconnect 80. Each of the stacked structure bodies 65 includes a memory layer 60 and a rectifying element 70.

Here, the stacking direction of the memory layer 60 and the rectifying element 70 is taken as a Z-axis direction. One direction perpendicular to the Z-axis direction is taken as an X-axis direction. A direction perpendicular to the Z-axis direction and the X-axis direction is taken as a Y-axis direction.

For example, in the bottommost element memory layer 66 of the nonvolatile memory device 201, the first interconnects 50 are word lines WL11, WL12, and WL13, and the second interconnects 80 are bit lines BL11, BL12, and BL13. For example, in the bottommost element memory layer 66, the first interconnects 50 extend in the X-axis direction, and the second interconnects 80 extend in the Y-axis direction orthogonal to the X-axis direction. The first interconnects 50, the second interconnects 80, and the stacked structure bodies 65 provided therebetween are stacked in the Z-axis direction orthogonal to the X-axis direction and the Y-axis direction.

In the second element memory layer 66 from the bottom, the first interconnects 50 are word lines WL21, WL22, and WL23, and the second interconnects 80 are bit lines BL11, BL12, and BL13.

Further, in the third element memory layer 66 from the bottom, the first interconnects 50 are word lines WL21, WL22, and WL23, and the second interconnects 80 are bit lines BL21, BL22, and BL23. Furthermore, in the uppermost (the fourth from the bottom) element memory layer 66, the first interconnects 50 are word lines WL31, WL32, and WL33, and the second interconnects 80 are bit lines BL21, BL22, and BL23. These word lines are collectively called as a "word line WL," and these bit lines are collectively called as a "bit line BL."

In the case of the nonvolatile memory device 201, four layers of the element memory layers 66 are stacked. However, in the nonvolatile memory device 201 according to this embodiment, the stacking number of the element memory layers 66 is arbitrary. Such a nonvolatile memory device 201 can be provided on a semiconductor substrate. Each layer of the element memory layers 66 can be disposed parallel to the major surface of the semiconductor substrate. In other words, the element memory layers 66 are multiply staked parallel to the major surface of the semiconductor substrate.

An inter-layer insulation film, which is not illustrated, is provided between the first interconnect 50, the second interconnect 80, and the stacked structure body 65 recited above, respectively, as well as between the inter-layer insulation films.

In FIGS. 2A to 2C, in order to avoid complicacy, three first interconnects 50 and three second interconnects 80 in each of the element memory layers 66 are illustrated. However, in the nonvolatile memory device 201 according to this embodiment, the number of the first interconnects 50 and the number of the second interconnects 80 are arbitrary, and the number of the first interconnects 50 may differ from the number of the second interconnects 80.

In the two adjacent element memory layers 66, the first interconnects 50 and the second interconnects 80 are shared. In other words, as illustrated in FIGS. 2 A to 2C, the word lines WL21, WL22, and WL23 are shared by the upper and lower element memory layers 66, and the bit lines BL11, BL12, and BL13 and the bit lines BL21, BL22, and BL23 are shared by the upper and lower element memory layers 66. However, the embodiment is not limited thereto. In each of the stacked element memory layers 66, the word lines WL and the bit lines BL may be independently provided, respectively. In the case where the word lines WL and the bit lines BL are provided independently in each of the element memory layers 66 respectively, the extending direction of the word lines WL and the extending direction of the bit lines BL may be changed in each of the element memory layers 66.

Although the first interconnects 50 are taken as the word lines WL and the second interconnects 80 are taken as the bit lines BL here, the first interconnects 50 may be taken as the bit lines BL and the second interconnects 80 may be taken as the word lines WL. In other words, the bit lines BL and the word lines WL can replace each other. Hereinbelow, the case is described where the first interconnects 50 are the word lines WL and the second interconnects 80 are the bit lines BL.

In each of the element memory layers 66 as illustrated in FIG. 2B, FIG. 2C, and FIG. 3, the stacked structure body 65 including the memory layer 60 and the rectifying element 70 is provided in a portion (a crossing point) where the first interconnect 50 and the second interconnect 80 intersect three-dimensionally. The memory layer 60 in each crossing point becomes one memory unit, and the stacked structure body 65 including the memory layer 60 becomes one memory cell MC.

Although the rectifying element 70 is provided on the first interconnect 50 side and the memory layer 60 is provided on the second interconnect 80 side in the example illustrated in FIG. 2B and FIG. 2C, the memory layer 60 may be provided on the first interconnect 50 side and the rectifying element 70 may be provided on the second interconnect 80 side. Further, the stacking order of the rectifying element 70 and the memory layer 60 with respect to the first interconnect 50 and the second interconnect 80 may be changed for every element memory layer 66. Thus, the stacking order of the rectifying element 70 and the memory layer 60 is arbitrary.

For the rectifying element 70, various kinds of diodes such as, for example, a pin diode having a stacked film in which p-type impurities and n-type impurities are doped in a polycrystalline silicon layer, a Schottky diode having a Shottkey barrier formed in an interface of metal and a semiconductor, and an MIM (Metal Insulator Metal) diode having a stacked structure of metal/insulator/metal, can be used.

As illustrated in FIG. 1, the nonvolatile memory device 201 includes a first conductive layer 110, a second conductive layer 120, a resistance change layer 130 provided between the first conductive layer 110 and the second conductive layer 120, and the rectifying element 70 provided on a side of the first conductive layer 110 opposite to the second conductive layer 120. In other words, the first conductive layer 110 is provided between the rectifying element 70 and the second conductive layer 120. The memory layer 60 recited above includes the first conductive layer 110, the second conductive layer 120, and the resistance change layer 130.

The electrical resistance of the resistance change layer 130 changes by at least one of an electric field applied to the resistance change layer 130 and a current applied to the resistance change layer 130. For the resistance change layer 130, a transition metal oxide is used, for example. For the resistance change layer 130, various materials such as, for example, TiO, HfO, NiO and CoO are used.

The first conductive layer 110 has a first major surface 110$f$ and a second major surface 110$m$. The first major surface 110$f$ is a face on a side opposite to the second conductive layer 120, and the first major surface 110$f$ faces the resistance change layer 130. The second major surface 110$m$ is a face on a side opposite to the rectifying element 70. In other words, the rectifying element 70 is provided to face the second major surface 110$m$ of the first conductive layer 110.

The second conductive layer 120 has a third major surface 120$f$, a fourth major surface 120$m$, a side face 120$s$, and a corner part 120$c$.

The third major surface 120$f$ faces the first major surface 110$f$ and includes a plane parallel to the first major surface 110$f$. The fourth major surface 120$m$ is provided on a side of the third major surface 120$f$ opposite to the first major surface 110$f$. In other words, the third major surface 120$f$ is provided between the fourth major surface 120$m$ and the first major surface 110$f$. The side face 120$s$ is connected with the third major surface 120$f$ and the fourth major surface 120$m$. The corner part 120$c$ is provided between the third major surface 120$f$ and the side face 120$s$. The corner part 120$c$ has a curvature larger (higher) than that of the third major surfaces 120$f$. Further, the curvature of the corner part 120$c$ can be set larger (higher) than that of the side face 120$s$.

In other words, the third major surface 120$f$ of the second conductive layer 120 is a face that faces the first conductive layer 110. The fourth major surface 120$m$ of the second conductive layer 120 is a face on a side of the second conductive layer 120 opposite to the third major surface 120$f$.

In this specific example, the first major surface 110$f$ of the first conductive layer 110 is a plane perpendicular to the stacking direction from the first conductive layer 110 toward the second conductive layer 120. Accordingly, the third major surface 120$f$ of the second conductive layer 120 is a plane perpendicular to the stacking direction recited above. In this specific example, the stacking direction from the first conductive layer 110 toward the second conductive layer 120 is the Z-axis direction.

The fourth major surface 120$m$, the side face 120$s$, and the corner part 120$c$ are farther than the third major surface 120$f$ from the first conductive layer 110. In other words, the third major surface 120$f$ is a portion of the second conductive layer 120 most proximal to the first conductive layer 110.

In this specific example, the side face 120$s$ of the second conductive layer 120 is in contact with the resistance change layer 130. The third major surface 120$f$, the corner part 120$c$, and the side face 120$s$ of the second conductive layer 120 are enclosed and covered with the resistance change layer 130.

Since the curvature of the corner part 120$c$ is larger than that of the third major surface 120$f$, an electric field between the first conductive layer 110 and the second conductive layer 120 concentrates in the resistance change layer 130 contacting the corner part 120$c$.

Here, the curvature described above is the curvature of the third major surface 120$f$, the side face 120$s$, and the corner part 120$c$ when cutting the second conductive layer 120 by a plane parallel to a direction (Z-axis direction) from the first conductive layer 110 toward the second conductive layer 120. In other words, the curvature of the corner part 120$c$ when cutting the corner part 120$c$ by a plane (for example, a Z-X plane or a Z-Y plane) parallel to the direction (the Z-axis direction) from the first conductive layer 110 toward the second conductive layer 120 is larger than the curvature of the third major surface 120$f$ when cutting the third major surface 120$f$ by the plane parallel to the Z-axis direction. In this specific example, the curvature of the corner part 120$c$ is larger than the curvature of the side face 120$s$ when cutting the side face 120$s$ by the plane parallel to the Z-axis direction.

Here, curvature is the reciprocal of the curvature radius. Therefore, curvature in a plane with an infinite curvature radius is considered to be zero. Accordingly, the curvature of the third major surface 120$f$, which is substantially a plane, is considered to be zero. In the case where the shape of the side face 120$s$ when cutting the side face 120$s$ by a plane (for example, the Z-X plane or the Z-Y plane) parallel to the Z-axis is a straight line, the curvature of the side face 120$s$ is considered to be zero.

Although it depends on the formation method of the second conductive layer 120, a corner between the third major surface 120$f$ and the side face 120$s$ generally forms a curved surface having roundness in many cases as viewed microscopically. The corner part 120$c$ may have roundness. In such a case, the curvature of the corner part 120$c$ is larger than the curvature of third major surface 120$f$. In the case where the shape of the second conductive layer 120 when cutting the second conductive layer 120 by a plane parallel to the Z-axis direction is trapezoid and the corner part 120$c$ does not have roundness, the curvature is considered to be infinite, for example. In such a case as well, the corner part 120$c$ has curvature larger than that of the third major surface 120$f$.

In this specific example, the area of the fourth major surface 120$m$ is larger than the area of the third major surface 120$f$. In other words, the area of the third major surface 120$f$ is smaller than the area of the fourth major surface 120$m$. Specifically, a cutting length (for example, a third length d2$f$ along the Y-axis direction) of the third major surface 120$f$ in a cutting plane parallel to the stacking direction (the Z-axis direction) is shorter than a cutting length (for example, a fourth length d2$m$ along the Y-axis direction) of the fourth major surface 120$m$ in the cutting plane. The side face 120$s$ of the second conductive layer 120 expands from the third major surface 120$f$ side toward the fourth major surface 120$m$ side.

The cutting length (for example, the third length d2f along the Y-axis direction) of the third major surface 120f in the cutting plane (the cutting plane parallel to the Z-axis direction, i.e., the stacking direction) perpendicular to the third major surface 120f is shorter than a cutting length (for example, a second length dim along the Y-axis direction) of the second major surface 110m in the cutting plane.

In other words, the cutting length (the second length d1m) of the second major surface 110m of the first conductive layer 110 on the rectifying element 70 side in the cutting plane parallel to the stacking direction (the Z-axis direction) is longer than the cutting length (the third length d2f) of the third major surface 120f in the cutting plane recited above. Thereby, the area of the second major surface 110m in which the second conductive layer 120 and the rectifying element 70 contact each other becomes large, and a current can be efficiently flowed to the rectifying element 70. In this specific example, the cutting length (the second length d1m) of the second major surface 110m of the first conductive layer 110 in the cutting plane parallel to the stacking direction (the Z-axis direction) is longer than the cutting length (the fourth length d2m) of the fourth major surface 120m in the cutting plane recited above.

Thus, in the nonvolatile memory device 201, the area of the third major surface 120f is smaller than the area of the second major surface 110m of the first conductive layer 110 on a side opposite to the rectifying element 70. In this specific example, the size of the first conductive layer 110 (the size of the first conductive layer 110 in the X-Y plane) is the same as the size of the memory cell MC (the size of the resistance change layer 130 in the X-Y plane), for example. In other words, the second length dim of the first conductive layer 110 is the same as the length of one side of the memory cell MC. And, the size of the third major surface 120f (the size of the third major surface 120f in the X-Y plane) is smaller than the size of the memory cell MC. In other words, the third length d2f is smaller than the length of one side of the memory cell MC.

Because the area of the third major surface 120f of the second conductive layer 120 is small, an electric field concentrates in the corner part 120c having a large curvature in the circumference of the third major surface 120f. Then, a filament F1 described below is formed in the resistance change layer 130 contacting an electric field concentration portion.

By such a configuration, as described below, a nonvolatile memory device, which allows a stable operation, can be provided.

The nonvolatile memory device 201 can further include the word lines WL (the first interconnects 50) and the bit lines BL (the second interconnects 80) which are provided so as to sandwich the stacked structure body 65 (the memory layer 60 and the rectifying element 70) recited above. For the stacked structure body 65 (the memory layer 60 and the rectifying element 70) recited above, at least one of application of a voltage and application of a current is performed via the word line WL and the bit line BL.

At least one of the first conductive layer 110 and the second conductive layer 120 may be shared with at least one of the word line WL and the bit line BL.

In other words, as long as the first conductive layer 110 and the second conductive layer 120 are conductive materials having the function to apply a voltage to the resistance change layer 130 and to apply a current, the configurations and materials are arbitrary.

An inter-layer insulating layer 150 is provided around the stacked structure body 65.

Figure 4:
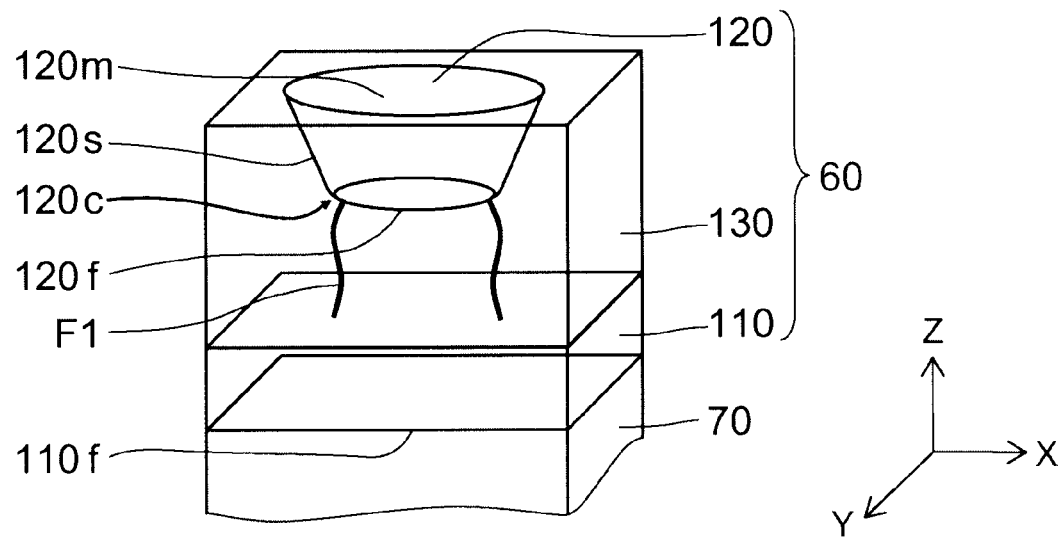
FIG. 4 is a schematic perspective view illustrating an operation of the nonvolatile memory device according to the first embodiment.

FIG. 4 is a schematic perspective view illustrating an operation of the nonvolatile memory device according to the first embodiment.

As illustrated in FIG. 4, in the nonvolatile memory device 201 according to the embodiment, the area of the third major surface 120f, which is an end of the second conductive layer 120 of the memory layer 60, is smaller than the area of the first conductive layer 110. And, the faces (the third major surface 120f, the side face 120s, and the corner part 120c) of the second conductive layer 120 on the first conductive layer 110 side is covered with the resistance change layer 130.

By such a structure, when a voltage is applied between the first conductive layer 110 and the second conductive layer 120, an electric field concentrates in the resistance change layer 130 contacting the corner part 120c, and the filament F1 is generated between the corner part 120c of the second conductive layer 120 and the first conductive layer 110. The corner part 120c aligns along the periphery of the third major surface 120f between the third major surface 120f and the side face 120s. In other words, in a linear region along the periphery of the third major surface 120f, the electric field concentrates and the filament F1 is formed between the linear portion and the first conductive layer 110. The filament F1 serves as a pass of current between the first conductive layer 110 and the second conductive layer 120.

Although the third major surface 120f is proximal to the first conductive layer 110, the third major surface 120f is parallel to the first conductive layer 110. Therefore, an electric field does not concentrate in the third major surface 120f. The electric field concentrates in the linear corner part 120c of the periphery of the third major surface 120f. Since the corner part 120c is linear along the periphery of the third major surface 120f, the electric field concentration part is also linear. In other words, the electric field is not concentrated excessively and not concentrated in one point. The electric field is moderately concentrated linearly.

Thus, in the nonvolatile memory device 201, the characteristic of the filament F1 become uniform because a place where the filament F1 is formed is controlled in one memory cell MC. Thereby, the operating characteristic of the memory layer 60 is made to be uniform. Thereby, variation in characteristics of a plurality of memory layers 60 provided in the nonvolatile memory device 201 is suppressed, and variations in the writing characteristic and the erasing characteristic between memory cells MC are suppressed. Since an electric field is concentrated moderately, problems described below, which are generated when an electric field is concentrated excessively, are suppressed.

In the conventional technology, in order to form the filament F1 serving as a current pass in the resistance change layer 130, a configuration in which an electric field concentration part is formed in an electrode (the first conductive layer 110 and the second conductive layer 120) is considered. However, in the conventional technology, there is no indication about the configuration of the electrode (the first conductive layer 110 and the second conductive layer 120) to obtain adequate characteristics of the whole stacked structure body 65 including the rectifying element 70 as well as to form an electric field concentration part simultaneously.

On the other hand, in this embodiment, a new configuration of the electrode (the first conductive layer 110 and the second conductive layer 120) to obtain adequate characteristics of the whole stacked structure body 65 including the rectifying element 70 is proposed.

In other words, the area of the second major surface 110m on the first conductive layer 110 side facing the rectifying element 70 is larger than the area of the fourth major surface 120*m* and the area of the third major surface 120*f* of the second conductive layer 120. Thereby, a current can be efficiently passed between the first conductive layer 110 and the rectifying element 70. Thereby, since a sufficiently large current can be passed to the memory layer 60 via the rectifying element 70, the resistance state of the memory layer 60 is detectable in high accuracy. Also, the resistance state of the memory layer 60 is controllable in high accuracy.

Thus, in the nonvolatile memory device 201 according to the embodiment, by reducing the area of the third major surface 120*f* of the second conductive layer 120 to control the position of the electric field concentration part, a position where the filament F1 is formed is controlled, and the electric field concentration part is formed in linear to suppress an excessive concentration of an electric field. At the same time, by enlarging the area of the second major surface 110*m* on a side of the rectifying element 70 of the first conductive layer 110, a current can be efficiently passed to the rectifying element 70. Thereby, a nonvolatile memory device, which allows a stable operation, can be provided.

FIG. 5A to FIG. 5F are schematic views illustrating the configurations and operations of nonvolatile memory devices of comparative examples.

Figure 5A:
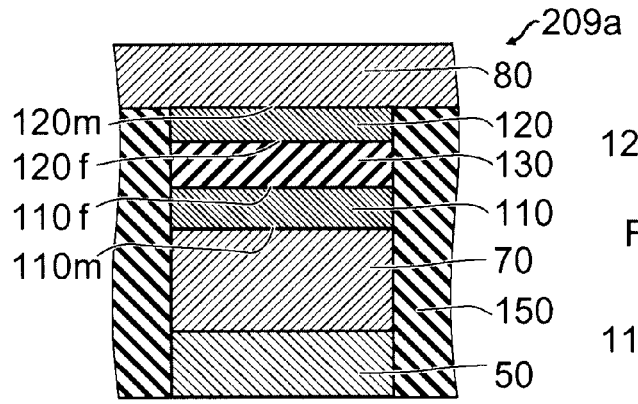
FIG. 5A to FIG. 5F are schematic views illustrating the configurations and operations of nonvolatile memory devices of comparative examples.
Figure 5B:
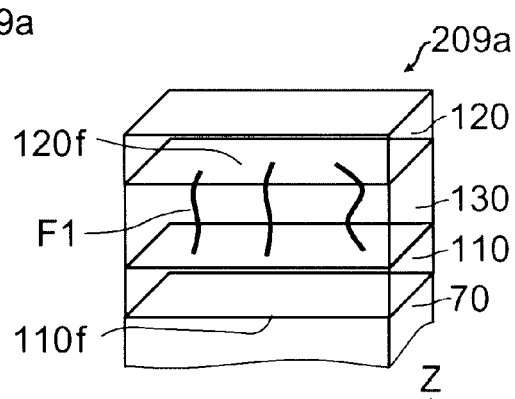
Figure 5C:
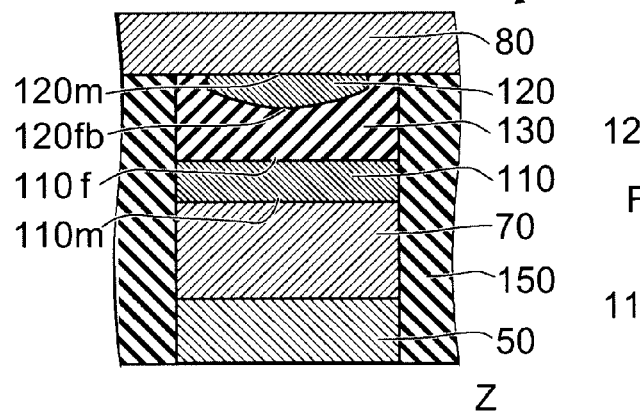
Figure 5D:
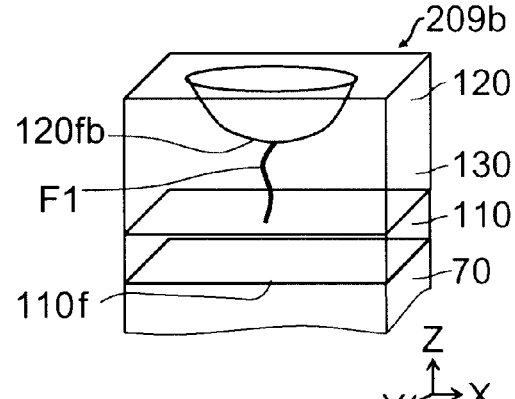
Figure 5E:
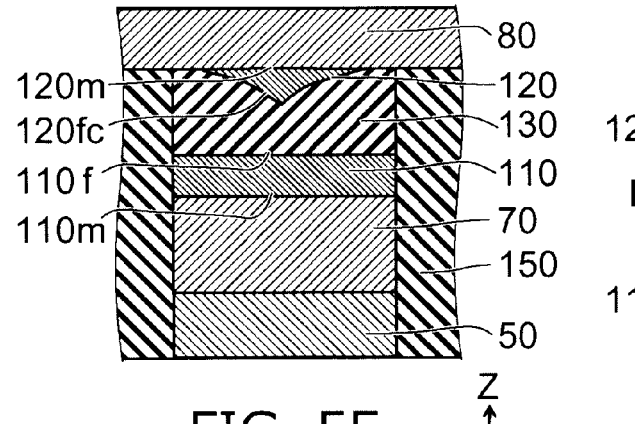
Figure 5F:
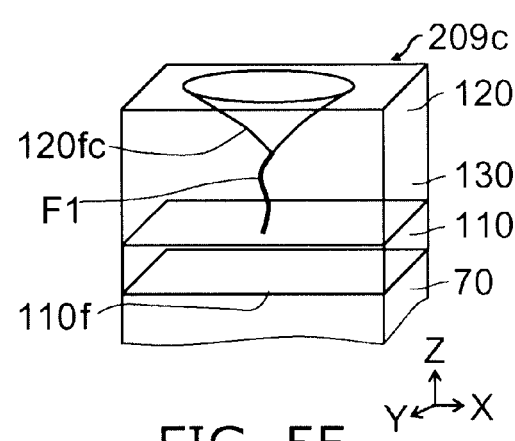

Namely, FIG. 5A and FIG. 5B are a schematic cross-sectional view and a schematic perspective view illustrating the configuration and operation of a nonvolatile memory device of a first comparative example. FIG. 5C and FIG. 5D are a schematic cross-sectional view and a schematic perspective view illustrating the configuration and operation of a nonvolatile memory device of a second comparative example. FIG. 5E and FIG. 5F are a schematic cross-sectional view and a schematic perspective view illustrating the configuration and operation of a nonvolatile memory device of a third comparative example.

First Comparative Example

As illustrated in FIG. 5A, in the nonvolatile memory device 209*a* of the first comparative example, the second conductive layer 120 has the same plane shape (a section in the X-Y plane) as the first conductive layer 110. In other words, the area of the third major surface 120*f* of the second conductive layer 120 on the first conductive layer 110 side is the same as the area of the fourth major surface 120*m*. The area of the third major surface 120*f* is the same as the area of the second major surface 110*m* of the first conductive layer 110 on the rectifying element 70 side.

For this reason, an electric field concentration part is not formed in the resistance change layer 130 provided between the faces (the third major surface 120*f* and the first major surface 110*f*) where the first conductive layer 110 and the second conductive layer 120 face each other.

For this reason, as illustrated in FIG. 5B, the filament F1 is formed in any place between the faces (the third major surface 120*f* and the first major surface 110*f*) where the first conductive layer 110 and the second conductive layer 120 face each other. For this reason, a position where the filament F1 is formed cannot be controlled and the operating characteristic of the memory layer 60 becomes uneven. Moreover, for example, if a current pass is formed in the inter-layer insulating layer 150 contacting an end portion of the faces (the third major surface 120*f* and the first major surface 110*f*) where the first conductive layer 110 and the second conductive layer 120 face each other, a current does not flow into the resistance change layer 130, but the current flows to a side face of the resistance change layer 130. Then, a desired characteristic in the resistance change is not obtained, and the operating characteristic becomes uneven also in this case.

Second Comparative Example

As illustrated in FIG. 5C, in the nonvolatile memory device 209*b* of the second comparative example, the second conductive layer 120 has a convex shape where the side of the first conductive layer 110 is expanded. The distance between the first conductive layer 110 and a face 120*fb* of the second conductive layer 120 on the first conductive layer 110 side is changed continuously. The second conductive layer 120 has a bowl-like shape. In other words, the second conductive layer 120 does not have a plane portion in a portion facing the first conductive layer 110. The second conductive layer 120 and the first conductive layer 110 approach mutually at one point of the top part of the convex of the second conductive layer 120. This configuration corresponds to the configuration described in Japanese Patent No. 416682.

For this reason, in the resistance change layer 130 provided between the faces (the face 120*fb* and the first major surface 110*f*) where the first conductive layer 110 and the second conductive layer 120 face each other, an electric field concentrates in one point.

Accordingly, as illustrated in FIG. 5D, the one point of the top part of the convex of the second conductive layer 120 becomes the electric field concentration part, and the filament F1 is formed in this portion. Although the position where the filament F1 is formed is controlled, the number of portions where the electric field concentrates is one. Thus, the characteristic of the electric field concentration part tends to deteriorate in a large number of times in operation. This may decrease the reliability of operation. For this reason, it is difficult to perform a stable operation as a result.

Third Comparative Example

As illustrated in FIG. 5E, in the nonvolatile memory device 209*c* of the third comparative example, the second conductive layer 120 has a convex shape protruding keenly to the first conductive layer 110 side. In other words, a side face 120*fc* of the second conductive layer 120 on the first conductive layer 110 side has a concave shape where the second conductive layer 120 side is dented. In this case as well, the second conductive layer 120 does not have a plane portion in the portion facing the first conductive layer 110. The second conductive layer 120 and the first conductive layer 110 approach mutually at one point of the convex end of the second conductive layer 120.

For this reason, as illustrated in FIG. 5F, an electric field concentrates in one point at the end of the second conductive layer 120, and the filament F1 is formed at this end. In this case as well, since the number of portions where the electric field concentrates is one, the characteristic of the electric field concentration part tends to deteriorate in a large number of times in operation. This may decrease the reliability of operation. For this reason, it is difficult to perform a stable operation as a result.

Thus, in the first comparative example, the electric field concentration part is not provided and the operating characteristic is not uniform. In the second comparative example and the third comparative example, since the electric field concentration part is formed in one point, the reliability of operation easily decreases.

On the other hand, in the nonvolatile memory device 201 according to the embodiment, the third major surface 120*f* is a plane and the electric field concentration part is provided in the corner part 120c, which is a linear region along the periphery of the third major surface 120f. Accordingly, the filament F1 is controlled to be formed in the corner part 120c of the linear region and the operating characteristic is made uniform. Simultaneously, since the electric field concentration part is formed in not one point but linear, the degradation of the characteristic can be suppressed in a large number of times of operation, for example. In other words, by making the electric field concentration part into linear, the reliability of operation can increase as compared with the case where the electric field concentration part is a point.

In the nonvolatile memory device 201 according to the embodiment, after forming the memory layer 60 and the rectifying element 70, for example, a forming operation is implemented to apply a high voltage to the memory layer 60, and the filament F1 recited above is formed between the first conductive layer 110 and the second conductive layer 120.

In particular, in the nonvolatile memory device 201, by setting the second conductive layer 120 having a small area to be an anode (setting the first conductive layer 110 to be a cathode), it is possible to perform a reset operation, which shifts from a low resistance state to a high resistance state, with a small current. By such a configuration, the power consumption of the nonvolatile memory device 201 can be reduced, and it is more preferable.

An example of a method for manufacturing the nonvolatile memory device 201 will be described.

FIG. 6A to FIG. 6F are schematic cross-sectional views of processes, illustrating the method for manufacturing the nonvolatile memory device according to the first embodiment.

Figure 6A:
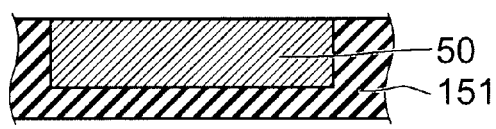
FIG. 6A to FIG. 6F are schematic cross-sectional views of processes, illustrating a method for manufacturing the nonvolatile memory device according to the first embodiment.

As illustrated in FIG. 6A, a drive circuit (also including a control circuit) for the memory cells is formed on a substrate, which is not illustrated, by a CMOS production process. An inter-layer insulation film 151 of a silicone oxide film is formed thereon using, for example, a plasma CVD method. The inter-layer insulation film 151 becomes a part of the inter-layer insulating layer 150. Then, the first interconnect 50 of tungsten is formed inside the inter-layer insulation film 151 using, for example, a damascene process.

A PVD method and a CVD method can be used for forming the first interconnect 50. In the damascene process, the CVD method is more preferable because it excels in coverage.

Figure 6B:
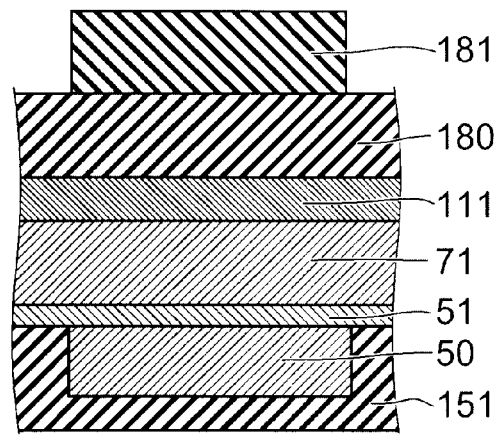

Then, as illustrated in FIG. 6B, a conductive film 51 is formed on the first interconnect 50. The thickness of the conductive film 51 is set to be, for example, 5 nm (nanometers) to 20 nm. For the conductive film 51, a material with oxidation resistance such as, for example, titanium nitride and tantalum nitride can be used. The PVD method and an ALD method, for example, are used for forming the conductive film 51.

A rectifying element film 71 serving as the rectifying element 70 is formed on the conductive film 51. For example, a polysilicon PIN diode layer is used for the rectifying element film 71, and the rectifying element film 71 is formed using, for example, a LPCVD method.

A first conductive film 111 serving as the first conductive layer 110 is formed on the rectifying element film 71. The thickness of the first conductive film 111 is set to be, for example, 5 nm to 20 nm. For the first conductive film 111, a conductive material with oxidation resistance such as, for example, titanium nitride and tantalum nitride can be used. The PVD method and the ALD method, for example, can be used for forming the first conductive film 111.

A sacrifice film 180 is formed on the first conductive film 111. For the sacrifice film 180, a silicon nitride film, for example, is used. The ALD method and the LPCVD method, for example, can be used for forming the sacrifice film 180.

Other material may be used for the sacrifice film 180, as long as the material has selective etching properties to a silicone oxide film.

On the sacrifice film 180, a resist is applied and a resist layer 181 for patterning the memory cell is formed using photo lithography technology.

Figure 6C:
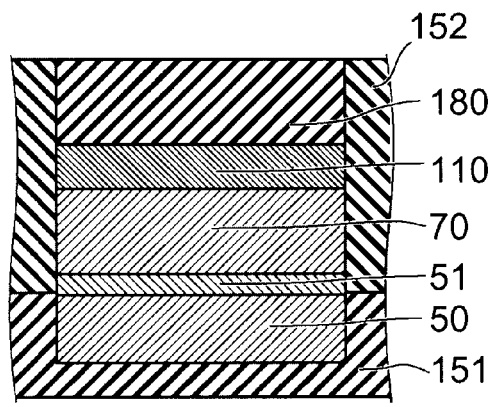

As illustrated in FIG. 6C, the sacrifice film 180, the first conductive film 111, the rectifying element film 71 and the conductive film 51 are collectively processed using the resist layer 181 as a mask. For example, a reactive ion etching method (RIE method) can be used for this processing. Thereby, the first conductive layer 110 and the rectifying element 70 are formed.

Then, the resist layer 181 and a processing residual substance are removed. A silicone oxide film is filled into a region (becoming a region between the memory cells) where the sacrifice film 180, the first conductive film 111, the rectifying element film 71 and the conductive film 51 are removed, and an inter-layer insulation film 152 becoming other part of the inter-layer insulating layer 150 is formed. For example, a PECVD method or the applying method can be used for forming the inter-layer insulation film 152.

Then, the inter-layer insulation film 152 is removed using, for example, a CMP method until the surface of the sacrifice film 180 is exposed.

Figure 6D:
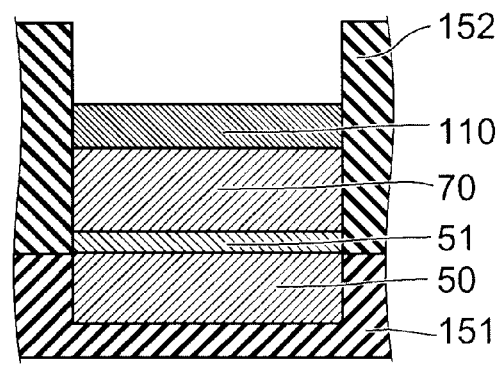

Then, as illustrated in FIG. 6D, using, for example, hot phosphoric acid, the sacrifice film 180 is removed to expose the surface of the first conductive layer 110.

Figure 6E:
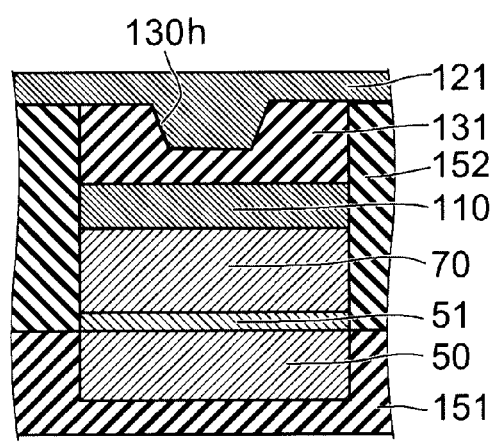

Then, as illustrated in FIG. 6E, a resistance change film 131 serving as the resistance change layer 130 is formed on the first conductive layer 110. For the resistance change film 131, for example, an oxide of a transition metal can be used, and, for example, hafnia, zirconia, titania, tantalum oxide, etc. can be used. The thickness of the resistance change film 131 can be set to be 5 nm to 20 nm. The ALD method, for example, is used for forming the resistance change film 131.

Etch back is performed on the resistance change film 131 to form a hole 130h in the resistance change film 131. The opening of the hole 130h is larger than the bottom face of the hole 130h, and the side face of the hole 130h can be made into a taper like. The depth of the hole 130h is the depth in the middle of the resistance change film 131, and the hole 130h does not reach the first conductive layer 110.

A second conductive film 121 serving as the second conductive layer 120 is formed on the resistance change film 131. For the second conductive film 121, a conductive material with oxidation resistance, such as titanium nitride and tantalum nitride can be used. The thickness of the second conductive film 121 can be set to be, for example, 5 nm to 20 nm. The PVD method and the ALD method, for example, can be used for forming the second conductive film 121.

Figure 6F:
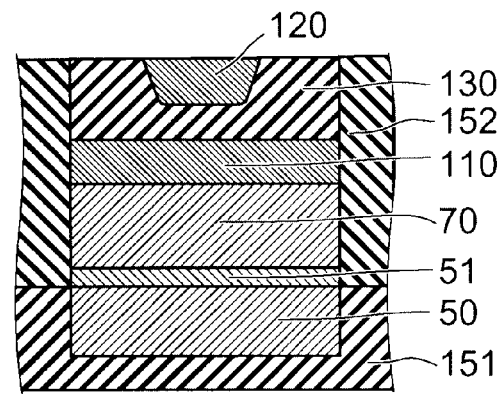

Then, as illustrated in FIG. 6F, the second conductive film 121 (and the resistance change film 131 as necessary) on the inter-layer insulation film 152 is removed by, for example, the CMP method to expose the inter-layer insulation film 152. Thereby, the second conductive layer 120 is formed. After post-processing (for example, anneal, etc.), a metal film serving as the second interconnect 80 is formed, and the metal film is processed into a predetermined shape. Thereby, the nonvolatile memory device 201 illustrated in FIG. 1 is manufactured.

FIG. 7A to FIG. 7F are schematic cross-sectional views of processes, illustrating a method for manufacturing another nonvolatile memory device according to the first embodiment.

As illustrated in FIG. 7A, the first interconnect 50 of tungsten is formed inside the inter-layer insulation film 151.

Then, as illustrated in FIG. 7B, the conductive film 51, the rectifying element film 71, the first conductive film 111, and the sacrifice film 180 are formed sequentially on the first interconnect 50, and the resist layer 181 is formed. In this specific example, the width of the resist layer 181 is made smaller than the width of the first interconnect 50.

Then, as illustrated in FIG. 7C, the sacrifice film 180, the first conductive film 111, the rectifying element film 71 and the conductive film 51 are collectively processed using the resist layer 181 as a mask, and the first conductive layer 110 and the rectifying element 70 are formed. Then, the inter-layer insulation film 152 of a silicone oxide film is formed in a region where the sacrifice film 180, the first conductive film 111, the rectifying element film 71 and the conductive film 51 are removed. Then, the inter-layer insulation film 152 is removed using, for example, the CMP method until the surface of the sacrifice film 180 is exposed.

Then, as illustrated in FIG. 7D, the sacrifice film 180 is removed, and a hole 152h is formed to expose the surface of the first conductive layer 110. Subsequently, etch back is performed on the inter-layer insulation film 152 to make the side face of the hole 152h to incline. In other words, the bottom face of the hole 152h is the first conductive layer 110, the side face of the inter-layer insulation film 152 has an inclined taper like shape, and the opening of the hole 152h is larger than the bottom face of the hole 152h.

Then, as illustrated in FIG. 7E, the resistance change film 131 and the second conductive film 121 are formed on the first conductive layer 110.

Then, the second conductive film 121 and the resistance change film 131 on the inter-layer insulation film 152 are removed by, for example, the CMP method, to expose the inter-layer insulation film 152. After post-processing (for example, anneal, etc.), a metal film serving as the second interconnect 80 is formed, and the metal film is processed into a predetermined shape. Thereby, the nonvolatile memory device 201a illustrated in FIG. 7F is manufactured.

In the nonvolatile memory device 201a as well, the corner part 120c having a curvature larger than that of the third major surface 120f and serving as the linear electric field concentration part is provided in the second conductive layer 120. The size of the second major surface 110m of the first conductive layer 110 on the rectifying element 70 side is the same as the size (the size of the resistance change layer 130 in the X-Y plane) of the memory cell MC. In other words, the area of the second major surface 110m is larger than the area of the fourth major surface 120m and the area of the third major surface 120f of the second conductive layer 120.

Thereby, a stable operation is possible by controlling the filament F1 by the linear electric field concentration part of the corner part 120c of the second conductive layer 120 and the effect of efficient application of a current to the rectifying element 70.

Figure 8A:
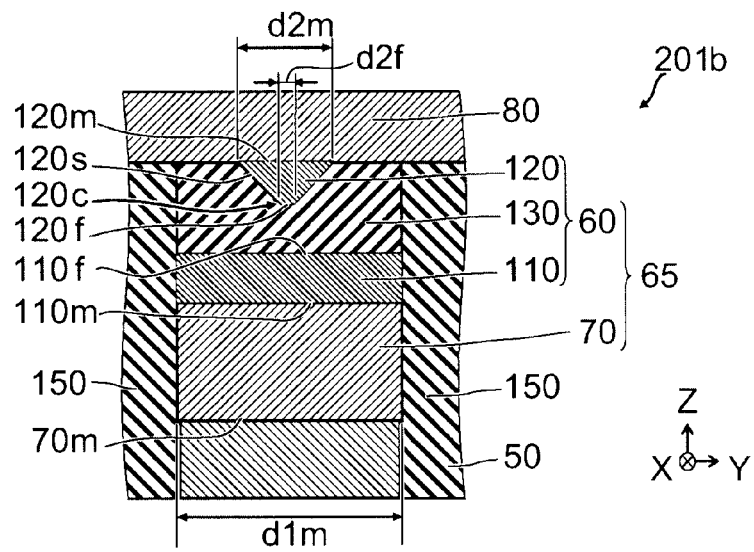
FIG. 8A to FIG. 8C are schematic cross-sectional views illustrating the configurations of other nonvolatile memory devices according to the first embodiment.
Figure 8B:
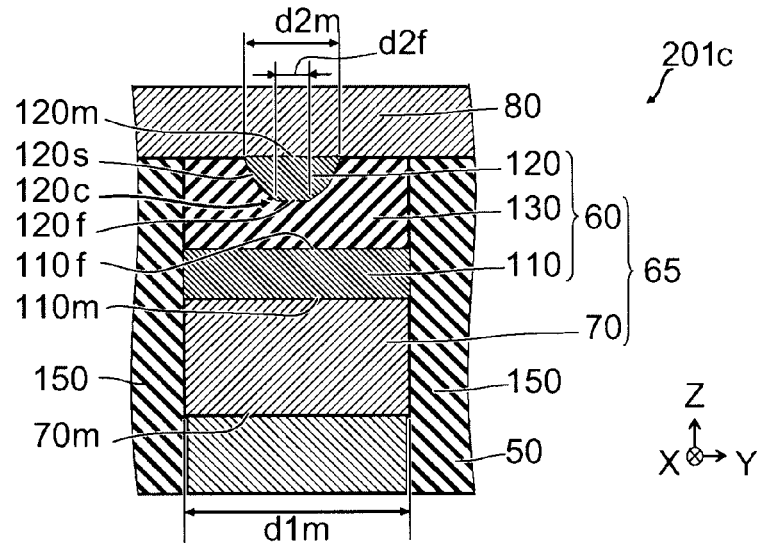
Figure 8C:
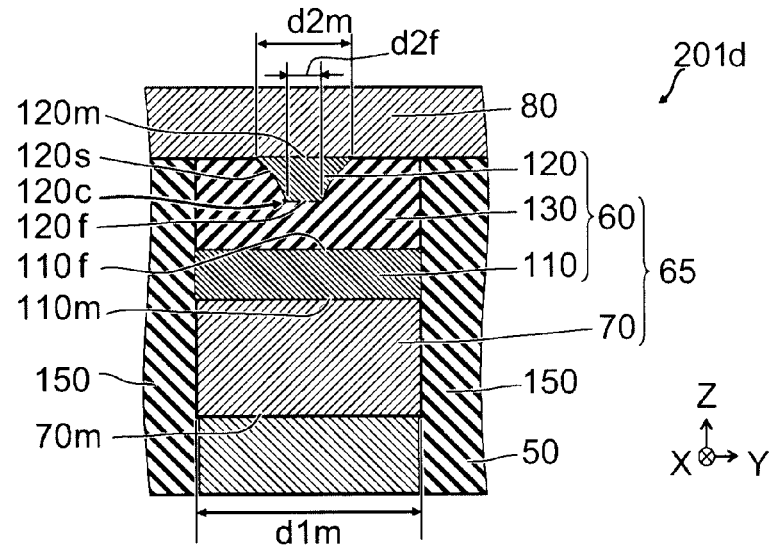

FIG. 8A to FIG. 8C are schematic cross-sectional views illustrating the configurations of other nonvolatile memory devices according to the first embodiment.

As illustrated in FIG. 8A, in the other nonvolatile memory device 201b according to the embodiment, a configuration is employed in which the area of the third major surface 120f of the second conductive layer 120 in the nonvolatile memory device 201 is quite smaller than the area of the fourth major surface 120m, and the third length d2f of the third major surface 120f is smaller than a half of the fourth length d2m of the fourth major surface 120m.

Thus, by setting the area of the third major surface 120f to be smaller than the area of the second major surface 110m, an electric field easily concentrates in the corner part 120c of the periphery of the third major surface 120f. The value of the area of the third major surface 120f is arbitrary. In this case as well, the second length d1m of the second major surface 110m is longer than the third length d2f of the third major surface 120f.

As illustrated in FIG. 8B, in the other nonvolatile memory device 201c according to the embodiment, the side face 120s of the second conductive layer 120 in the nonvolatile memory device 201 has a shape of a convex expanding toward the outside of the second conductive layer 120. In the second conductive layer 120, the third major surface 120f, which is a plane, is provided. In this case as well, the curvature of the corner part 120c of the second conductive layer 120 is larger than the curvature of the third major surface 120f and the curvature of the side face 120s, and an electric field concentration part can be formed in the linear corner part 120c.

As illustrated in FIG. 8C, in the other nonvolatile memory device 201d according to the embodiment, the side face 120s of the second conductive layer 120 in the nonvolatile memory device 201 has a shape of a concave dented toward the second conductive layer 120 side. In the second conductive layer 120, the third major surface 120f, which is a plane, is provided. In this case as well, the curvature of the corner part 120c of the second conductive layer 120 is larger than the curvature of the third major surface 120f and the curvature of the side face 120s, and an electric field concentration part can be formed in the linear corner part 120c. Thus, the shape of the side face 120s is arbitrary as long as the curvature of the corner part 120c becomes larger than the curvature of the side face 120s.

Also in the nonvolatile memory devices 201b, 201c, and 201d having such configurations, a stable operation is possible by controlling the filament F1 by the linear electric field concentration part of the corner part 120c of the second conductive layer 120 and the effect of efficient application of a current to the rectifying element 70.

FIG. 9A to FIG. 9C are schematic cross-sectional views illustrating the configurations of other nonvolatile memory devices according to the first embodiment.

As illustrated in FIG. 9A, in the other nonvolatile memory device 201e according to the embodiment, a configuration is employed in which the area of the first major surface 110f of the first conductive layer 110 in the nonvolatile memory device 201 is smaller than the area of the second major surface 110m. Otherwise, the configuration of the nonvolatile memory device 201e is similar to that of the nonvolatile memory device 201; therefore, the description thereof is omitted.

Also at this time, the area of the second major surface 110m of the first conductive layer 110 on the rectifying element 70 side is larger than the area of the third major surface 120f and the area of the fourth major surface 120m of the second conductive layer 120 and is the same as the size (the size of the resistance change layer 130 in the X-Y plane) of the memory cell MC. In this specific example, the area of the second major surface 110m is the same as the area of a face (a rectifying element face 70m) of the rectifying element 70 on the first conductive layer 110 side.

Thereby, a stable operation is possible by controlling the filament F1 by the linear electric field concentration part of the corner part 120c of the second conductive layer 120 and the effect of efficient application of a current to the rectifying element 70.

As illustrated in FIG. 9B, in the other nonvolatile memory device 201f according to the embodiment, the area of the second major surface 110m of the first conductive layer 110 is smaller than the area of the face (the rectifying element face 70m) of the rectifying element 70 on the first conductive layer 110 side (the area of the face of the rectifying layer on the side of the first conductive layer 110). However, the area of the second major surface 110m of the first conductive layer 110 is larger than the area of the third major surface 120f and the area of the fourth major surface 120m of the second conductive layer 120. Otherwise, the configuration is similar to that of the nonvolatile memory device 201; therefore, the description thereof is omitted.

Thus, the area of the second major surface 110m of the first conductive layer 110 does not always have to be identical to the area of the face (the rectifying element face 70m) of the rectifying element 70 on the first conductive layer 110 side. It is sufficient for the area of the second major surface 110m of the first conductive layer 110 to be larger than the area of the third major surface 120f and the area of the fourth major surface 120m of the second conductive layer 120. Thereby, the cross-sectional area of a current pass flowing toward the rectifying element 70 through the first conductive layer 110 can be made larger than the cross-sectional area of a current pass flowing toward the third major surface 120f from the fourth major surface 120m of the second conductive layer 120.

By such a configuration as well, a stable operation is possible by controlling the filament F1 by the linear electric field concentration part of the corner part 120c of the second conductive layer 120 and the effect of efficient application of a current to the rectifying element 70.

As illustrated in FIG. 9C, in the other nonvolatile memory device 201g according to the embodiment, the area of the second major surface 110m of the first conductive layer 110 is smaller than the area of the face (the rectifying element face 70m) of the rectifying element 70 on the first conductive layer 110 side and is substantially the same as that of the fourth major surface 120m of the second conductive layer 120. However, in this case as well, the area of the second major surface 110m of the first conductive layer 110 is larger than the area of the third major surface 120f of the second conductive layer 120. Otherwise, the configuration of the nonvolatile memory device 201g is similar to that of the nonvolatile memory device 201; therefore, the description thereof is omitted.

In other words, in the nonvolatile memory device 201g, the second length d1m of the second major surface 110m is longer than the third length d2f of the third major surface 120f and is substantially the same as the fourth length d2m of the fourth major surface 120m.

The first length d1f of the first major surface 110f is shorter than the second length d1m of the second major surface 110m and is shorter than the fourth length d2m of the fourth major surface 120m.

In the nonvolatile memory device 201g as well, since the area of the second major surface 110m of the first conductive layer 110 is larger than the area of the corner part 120c of the second conductive layer 120 serving as the electric field concentration part, a current can be efficiently passed between the first conductive layer 110 and the rectifying element 70. In other words, in this case as well, a stable operation is possible by controlling the filament F1 by the linear electric field concentration part of the corner part 120c of the second conductive layer 120 and the effect of efficient application of a current to the rectifying element 70.

In order to pass a current efficiently between the first conductive layer 110 and the rectifying element 70, it is preferable that the area of the second major surface 110m of the first conductive layer 110 is as large as possible. In other words, it is more preferable that the cutting length (the second length d1m) of the second major surface 110m of the first conductive layer 110 in a cutting plane parallel to the stacking direction (the Z-axis direction) is substantially the same as or longer than a cutting length of the face (the rectifying element face 70m) of the rectifying element 70 on the first conductive layer 110 side in the cutting plane parallel to the stacking direction (the Z-axis direction).

In the nonvolatile memory devices 201 and 201a to 201g recited above, the cutting length (the third length d2f) of the third major surface 120f in the cutting plane parallel to the stacking direction (the Z-axis direction) is shorter than the cutting length (the fourth length d2m) of the fourth major surface 120m in the cutting plane. In other words, the side face 120s of the second conductive layer 120 expands from the third major surface 120f side toward the fourth major surface 120m side.

However, the embodiments are not limited thereto. The cutting length (the third length d2f) of the third major surface 120f in the cutting plane parallel to the stacking direction (the Z-axis direction) may not be less than the cutting length (the fourth length d2m) of the fourth major surface 120m in the cutting plane. In other words, the side face 120s of the second conductive layer 120 may be substantially parallel to the Z-axis direction, and the side face 120s may have a shape expanding from the fourth major surface 120m side toward the third major surface 120f side.

In other words, as long as the third major surface 120f is substantially a plane, the curvature of the corner part 120c of the periphery part of the third major surface 120f is larger than that of the third major surface 120f, and the linear electric field concentration part can be formed by the corner part 120c, the area and the shape of the fourth major surface 120m distal to the first conductive layer 110 are arbitrary.

An example of a method for manufacturing the nonvolatile memory device 201e will now be described.

Figure 10:
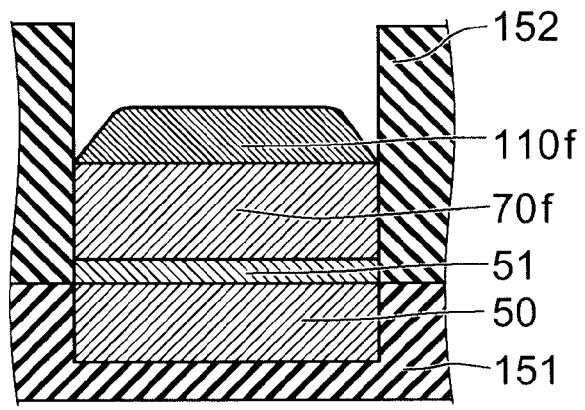
FIG. 10 is a schematic cross-sectional view of part of processes, illustrating a method for manufacturing another nonvolatile memory device according to the first embodiment.

FIG. 10 is a schematic cross-sectional view of part of processes, illustrating the method for manufacturing the other nonvolatile memory device according to the first embodiment.

By the same method as already described in FIG. 6A to FIG. 6D, the first interconnect 50, the conductive film 51, the rectifying element film 71, the first conductive film 111 and the sacrifice film 180 are formed sequentially. The sacrifice film 180, the first conductive film 111, the rectifying element film 71 and the conductive film 51 are collectively processed using the resist layer 181 as a mask. The inter-layer insulation film 152 of a silicone oxide film is formed in a region where the sacrifice film 180, the first conductive film 111, the rectifying element film 71 and the conductive film 51 are removed. After removing the inter-layer insulation film 152 until the surface of the sacrifice film 180 is exposed, the sacrifice film 180 is removed to expose the surface of the first conductive layer 110.

Then, as illustrated in FIG. 10, the first conductive film 111 is etched to form a convex shape. A dry etching can be used for etching the first conductive film 111, for example. The depth of the dry etching is several nanometers, for example. Thereby, the first conductive layer 110 having a convex shape is formed.

Then, the second interconnect 80 is formed after forming the resistance change film 131 and the second conductive film 121 by using the same techniques as described in regard to FIG. 6E and FIG. 6F. Thereby, the nonvolatile memory device 201e illustrated in FIG. 9A can be manufactured.

In the above, the nonvolatile memory devices 201f and 201g illustrated respectively in FIG. 9B and FIG. 9C can be manufactured in accordance with the thickness of the first conductive film 111 and the etching conditions of the first conductive film 111.

Figure 11:
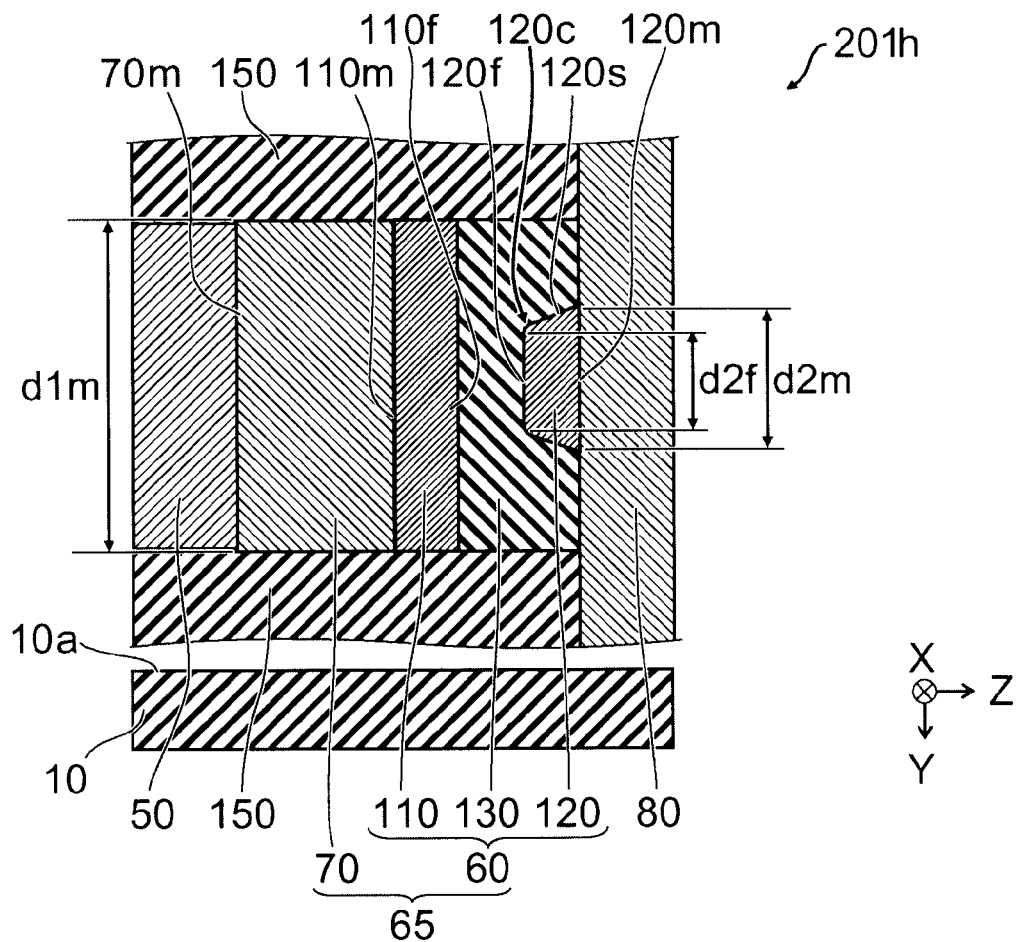
FIG. 11 is a schematic cross-sectional view illustrating the configuration of another nonvolatile memory device according to the first embodiment.

FIG. 11 is a schematic cross-sectional view illustrating the configuration of another nonvolatile memory device according to the first embodiment.

As illustrated in FIG. 11, in the other nonvolatile memory device 201h according to the embodiment, the first conductive layer 110 and the second conductive layer 120 face each other in a direction parallel to the major surface 10a of the substrate 10. In other words, the stacking direction (the Z-axis direction) from the first conductive layer 110 toward the second conductive layer 120 is set to be in parallel to the major surface 10a of the substrate 10. In this example, the Y-axis direction is set to be perpendicular to the major surface 10a of the substrate 10. Otherwise, the configuration of the nonvolatile memory device 201h is similar to that of the nonvolatile memory device 201. Thus, in the nonvolatile memory device according to this embodiment, the relationship between the stacking direction (the Z-axis direction) from the first conductive layer 110 toward the second conductive layer 120 and the major surface 10a of the substrate 10 is arbitrary. Furthermore, the stacking direction (the Z-axis direction) from the first conductive layer 110 toward the second conductive layer 120 may incline to the major surface 10a of the substrate 10.

Second Embodiment

Figure 12A:
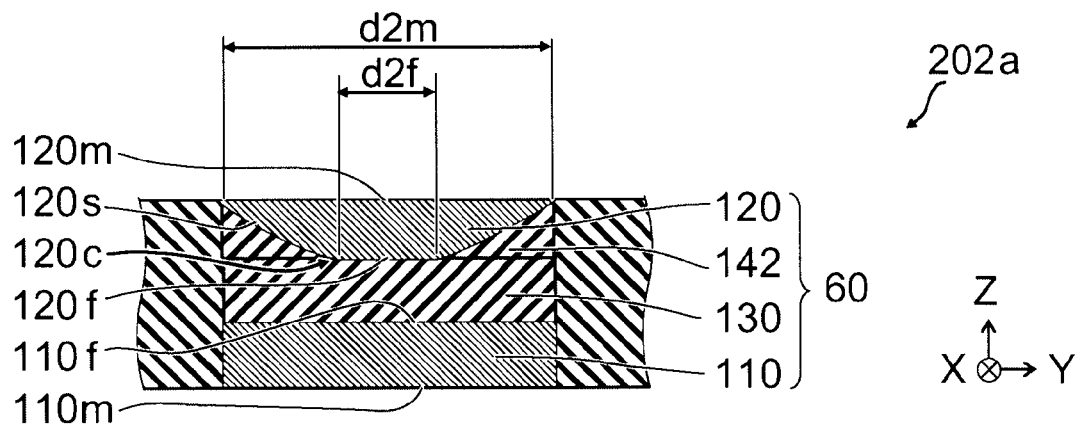
FIG. 12A and FIG. 12B are schematic cross-sectional views illustrating the configurations of nonvolatile memory devices according to a second embodiment.
Figure 12B:
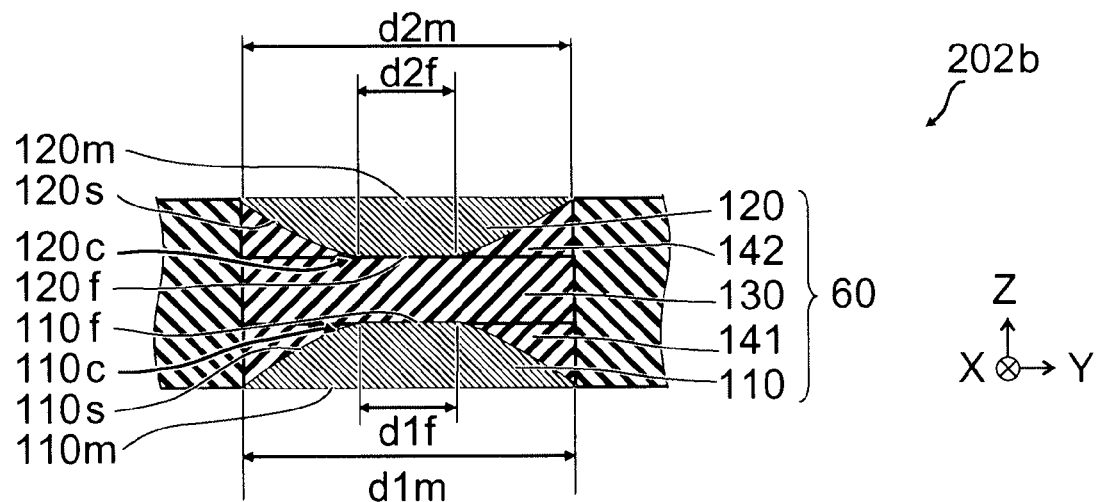

FIG. 12A and FIG. 12B are schematic cross-sectional views illustrating the configurations of nonvolatile memory devices according to a second embodiment.

Namely, FIG. 12A and FIG. 12B are cross-sectional views corresponding to a part of line A-A' of FIG. 2A and illustrating the configurations of the nonvolatile memory devices 202a and 202b according to this embodiment, respectively.

As illustrated in FIG. 12A, the nonvolatile memory device 202a according to this embodiment includes a first conductive layer 110, a second conductive layer 120, a resistance change layer 130, and a second-conductive-layer-side insulating layer 142.

The first conductive layer 110 has a first major surface 110f and a second major surface 110m on a side opposite to the first major surface 110f.

The second conductive layer 120 has a third major surface 120f, a fourth major surface 120m, a side face 120s and a corner part 120c.

The third major surface 120f faces the first major surface 110f and includes a plane parallel to the first major surface 110f. The fourth major surface 120m is provided on a side opposite to the third major surface 120f. The area of the fourth major surface 120m is larger than the area of the third major surface 120f. The side face 120s is connected with the third major surface 120f and the fourth major surface 120m. The corner part 120c is provided between the third major surface 120f and the side face 120s. The corner part 120c has a curvature larger than that of the third major surface 120f.

The resistance change layer 130 is provided between the first conductive layer 110 and the second conductive layer 120. The resistance of the resistance change layer 130 changes by at least one of an electric field applied to the resistance change layer 130 and a current applied to the resistance change layer 130. The resistance change layer 130 is in contact with the third major surface 120f.

The second-conductive-layer-side insulating layer 142 is provided between the side face 120s of the second conductive layer 120 and the resistance change layer 130. The second-conductive-layer-side insulating layer 142 is sandwiched by the side face 120s of the second conductive layer 120 and the resistance change layer 130.

For the second-conductive-layer-side insulating layer 142, a metal oxide, for example, is used. However, the embodiment is not limited thereto. For the second-conductive-layer-side insulating layer 142, any insulating materials can be used. The thickness of the second-conductive-layer-side insulating layer 142 (a length along the Z-axis direction, which is the stacking direction from the first conductive layer 110 toward the second conductive layer 120) increases along a direction from the central part (a central part in a X-Y plane) toward the peripheral part (a peripheral part in the X-Y plane) of the second conductive layer 120. In other words, the thickness of the second-conductive-layer-side insulating layer 142 increases toward the peripheral part from the central part of the region of the memory cell MC.

In the nonvolatile memory device 202a, a linear electric field concentration part is formed of the corner part 120c of the second conductive layer 120, and the second-conductive-layer-side insulating layer 142 is provided between the side face 120s and the resistance change layer 130. Thereby, a filament F1 is controlled by the linear electric field concentration part of the corner part 120c of the second conductive layer 120. By providing the second-conductive-layer-side insulating layer 142, the filament F1 is formed in high accuracy in the resistance change layer 130 which adjoins and contacts the corner part 120c, and the controllability is further improved. Thereby, a stable operation is possible.

The side face 120s of the second conductive layer 120 expands from the third major surface 120f side toward the fourth major surface 120m side. In other words, the side face 120s is taper-like. The second-conductive-layer-side insulating layer 142 is provided between the side face 120s of the second conductive layer 120 and the resistance change layer 130.

In this specific example, the second-conductive-layer-side insulating layer 142 is not in contact with the third major surface 120f, but is in contact with the side face 120s. Thereby, an end inside the boundary between the second-conductive-layer-side insulating layer 142 and the resistance change layer 130 aligns along the periphery of the third major surface 120f of the second conductive layer 120. In other words, the end inside the boundary between the second-conductive-layer-side insulating layer 142 and the resistance change layer 130 aligns along the corner part 120c of the second conductive layer 120. The corner part 120c contacts both the second-conductive-layer-side insulating layer 142 and the resistance change layer 130.

Thus, in this embodiment, the memory layer 60 includes the first conductive layer 110, the second conductive layer 120, the resistance change layer 130 and the second-conductive-layer-side insulating layer 142 (an insulating layer).

In the second conductive layer 120, the corner part 120c having a curvature larger than that of the third major surface 120f is provided in the periphery of the third major surface 120f. Thereby, a linear electric field concentration part is formed. Since the resistance change layer 130 is disposed on the first conductive layer 110 side form the second-conductive-layer-side insulating layer 142, an electric field concentrated by the electric field concentration part of the corner part 120c reaches to the first conductive layer 110 via the resistance change layer 130. Thereby, the filament F1 is formed in the resistance change layer 130 from the linear electric field concentration part corresponding to the corner part 120c.

Thus, the second conductive layer 120 is not surrounded by the resistance change layer 130, and the side face 120s of the second conductive layer 120 is surrounded by the second-conductive-layer-side insulating layer 142 which is different from the resistance change layer 130. In such a configuration as well, the filament F1 can be formed stably.

Thereby, a voltage in the forming operation to form a conductive pass in the resistance change layer 130 can be reduced, and, for example, a destruction of an element generated by application of a high voltage in the forming operation can be suppressed. Since the electric field concentration part is a linear shape, the electric field is not concentrated excessively. Therefore, the reliability is improved, and a stable operation is possible. And, the state (resistance value) of the filament F1 among memory cells can be made uniform. Thereby, a stable operation is possible.

In the nonvolatile memory device 202a according to the embodiment, by providing the second-conductive-layer-side insulating layer 142, the switching speed is accelerated and the controllability of the memory operation is improved. In other words, for example, in the case where the second-conductive-layer-side insulating layer 142 is formed of an oxide of metal used for the second conductive layer 120 and the generation energy of an oxide of the second-conductive-layer-side insulating layer 142 is smaller than the generation energy of an oxide of metal used for the resistance change layer 130, oxygen is easily supplied to a portion of the filament F1 in the resistance change layer 130 from the second-conductive-layer-side insulating layer 142 in the reset operation. In other words, the second-conductive-layer-side insulating layer 142 becomes easy to release oxygen. Thereby, the speed of the reset operation can be accelerated. Deep reset become possible, ON/OFF ratio can be increased, and the controllability of the memory operation can be improved.

Generally, when the insulating property is high, i.e., the bad gap is large, a material has a tendency to have a large generation energy of an oxide. When the insulating property is low, i.e., the band gap is small, a material has a tendency to have a small generation energy of an oxide.

As described above, in the case where the generation energy of an oxide of the second-conductive-layer-side insulating layer 142 is smaller than the generation energy of an oxide of the resistance change layer 130, the insulating property of the second-conductive-layer-side insulating layer 142 has a tendency to be lower than that of the resistance change layer 130.

However, the embodiment is not limited thereto. The insulating property of the second-conductive-layer-side insulating layer 142 may be higher than that of the resistance change layer 130. For example, in the case where a material having an insulation property higher than that of the resistance change layer 130 is used for the second-conductive-layer-side insulating layer 142, oxygen is easily supplied to the second-conductive-layer-side insulating layer 142 from the resistance change layer 130 in the reset operation, and the filament F1 becomes easily to be blocked. As a result, an effect, which the reset operation is accelerated, is obtained. In order to obtain this effect sufficiently, as described below, an oxidation treatment is performed from a side wall of the second conductive layer 120 to a region inside the resistance change layer 130 where the filament F1 is formed to sufficiently oxidize metal serving as the second conductive layer 120.

Thus, the insulating property of the second-conductive-layer-side insulating layer 142 may be lower or higher than the insulating property of the resistance change layer 130, or it may be the same as the insulating property of the resistance change layer 130.

In this embodiment, the first conductive layer 110 and the second conductive layer 120 can replace each other. In other words, in the above, an example is described in which the second-conductive-layer-side insulating layer 142 is provided in the second conductive layer 120, which is one of the two conductive layers provided in the both ends of the resistance change layer 130. However, a first conductive layer side insulating layer having the same configuration as the second-conductive-layer-side insulating layer 142 may be provided in the first conductive layer 110, which is one other of the two conductive layers provided in the both ends of the resistance change layer 130.

Furthermore, insulating layers may be provided in both sides of the first conductive layer 110 and the second conductive layer 120. In other words, as illustrated in FIG. 12B, the nonvolatile memory device 202b according to this embodiment further includes a first conductive layer side insulating layer 141 in addition to the nonvolatile memory device 202a.

In the first conductive layer 110 of the nonvolatile memory device 202b, the followings are further provided with respect to the nonvolatile memory device 202a.

The first conductive layer 110 further has a first-conductive-layer side face 110s and a first-conductive-layer corner part 110c in addition to the first major surface 110f and the second major surface 110m.

The first major surface 110f faces the third major surface 120f and is a plane parallel to the third major surface 120f. The second major surface 110m faces the first major surface 110f and has an area larger than the area of the first major surface 110f. The first-conductive-layer side face 110s is provided between the first major surface 110f and the second major surface 110m. The first-conductive-layer side face 110s is connected with the first major surface 110f and the second major surface 110m. The first-conductive-layer corner part 110c is provided between the first major surface 110f and the first-conductive-layer side face 110s and has a curvature larger (higher) than that of the first major surface 110f.

The first-conductive-layer-side insulating layer 141 is provided between the first-conductive-layer side face 110s of the first conductive layer 110 and the resistance change layer 130. In other words, the first-conductive-layer-side insulating layer 141 is sandwiched with the first-conductive-layer side face 110s and the resistance change layer 130.

For the first-conductive-layer-side insulating layer 141, a metal oxide is used. However, the embodiment is not limited thereto. Any insulating materials may be used for the first-conductive-layer-side insulating layer 141. The thickness of the first-conductive-layer-side insulating layer 141 (a length along the Z-axis direction, which is the stacking direction from the first conductive layer 110 toward the second conductive layer 120) increases from the central part (a central part in the X-Y plane) toward the peripheral part (a peripheral part in the X-Y plane) of the first conductive layer 110. In other words, the thickness of the first-conductive-layer-side insulating layer 141 increases from the central part toward the peripheral part of the region of the memory cell MC.

In the nonvolatile memory device 202b, a linear electric field concentration part is formed by the first-conductive-layer corner part 110c of the first conductive layer 110 and the corner part 120c of the second conductive layer 120. The first-conductive-layer-side insulating layer 141 is provided between the first-conductive-layer side face 110s and the resistance change layer 130. Furthermore, the second-conductive-layer-side insulating layer 142 is provided between the side face 120s and the resistance change layer 130. Thereby, the filament F1 is controlled by the linear electric field concentration parts of the first-conductive-layer corner part 110c and the corner part 120c. By providing the first-conductive-layer-side insulating layer 141 and the second-conductive-layer-side insulating layer 142, the filament F1 is formed in high accuracy at a portion of the resistance change layer 130 in contact with the first-conductive-layer corner part 110c and at a portion of the resistance change layer 130 in contact with the corner part 120c. The controllability is further improved. Thereby, a stable operation is possible.

In the nonvolatile memory devices 202a and 202b, the rectifying element 70 is provided as necessary. For example, in the case where a material in which a high resistance state and a low resistance state change depending on the polarity of a voltage applied to the resistance change layer 130 is used for the resistance change layer 130, and the like, the rectifying element 70 can be omitted. Thus, the rectifying element 70 does not always have to be provided.

Hereinbelow, the case is described where the rectifying element 70 is provided. Hereinbelow, it is assumed that the rectifying element 70 is provided on the first conductive layer 110 side (a side of the first conductive layer 110 opposite to the second conductive layer 120).

Figure 13A:
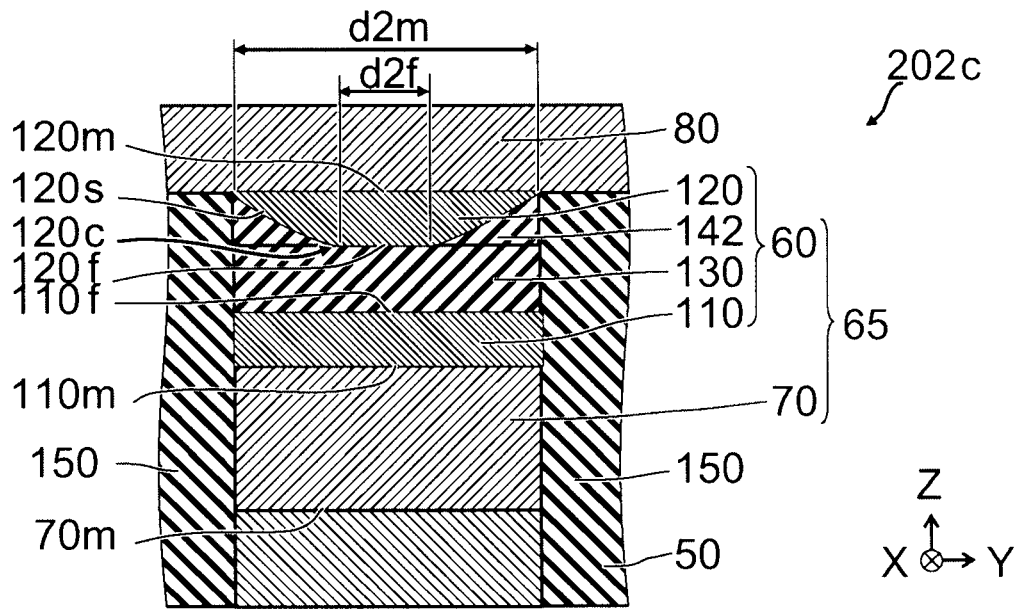
FIG. 13A and FIG. 13B are schematic cross-sectional views illustrating the configurations of other nonvolatile memory devices according to the second embodiment.
Figure 13B:
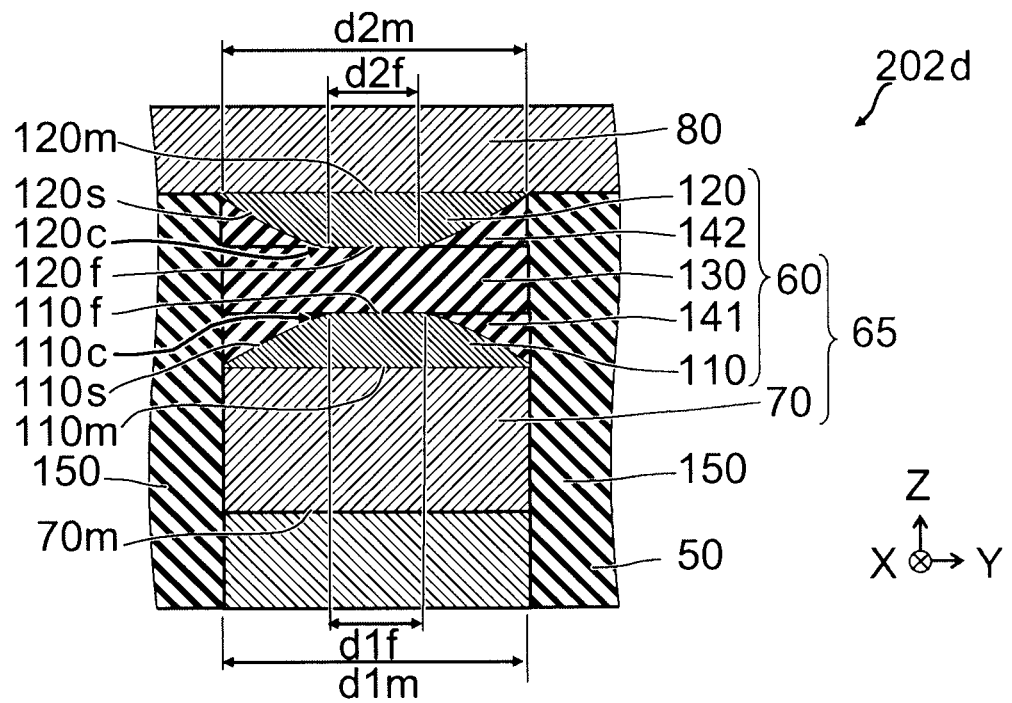

FIG. 13A and FIG. 13B are schematic cross-sectional views illustrating the configurations of other nonvolatile memory devices according to the second embodiment.

FIG. 13A and FIG. 13B are cross-sectional views corresponding to a part of line A-A' of FIG. 2A and illustrating the configurations of the other nonvolatile memory devices 202c and 202d according to the embodiment, respectively.

As illustrated in FIG. 13A, in the other nonvolatile memory device 202c according to the embodiment, the rectifying element 70 is further provided on the first conductive layer 110 side in the nonvolatile memory device 202a recited above. In other words, the first conductive layer 110 is disposed between the rectifying element 70 and the resistance change layer 130.

In other words, the nonvolatile memory device 202c further has the second-conductive-layer-side insulating layer 142 in addition to the first conductive layer 110, the second conductive layer 120, the resistance change layer 130 and the rectifying element 70 described in regard to the nonvolatile memory device 201 already described above.

By controlling the filament F1 by the linear electric field concentration part of the corner part 120c of the second conductive layer 120 and by providing the second-conductive-layer-side insulating layer 142, the filament F1 is formed in high accuracy in the corresponding resistance change layer 130 in contact with the corner part 120c, and the controllability can be improved. Since the second major surface 110m of the first conductive layer 110 is larger than the corner part 120c of the second conductive layer 120 serving as the electric field concentration part, a current can be passed efficiently between the first conductive layer 110 and the rectifying element 70. In other words, in this case as well, a stable operation is possible by controlling the filament F1 by the linear electric field concentration part of the corner part 120c of the second conductive layer 120 and the effect of efficient application of a current to the rectifying element 70.

As illustrated in FIG. 13B, in the other nonvolatile memory device 202d according to the embodiment, the rectifying element 70 is further provided on the first conductive layer 110 side in the nonvolatile memory device 202b recited above.

In other words, the nonvolatile memory device 202d has the first-conductive-layer-side insulating layer 141 and the second-conductive-layer-side insulating layer 142 in addition to the first conductive layer 110, the second conductive layer 120, the resistance change layer 130 and the rectifying element 70 described in regard to the nonvolatile memory device 201 already described above.

In the nonvolatile memory device 202d, an linear electric field concentration part is formed by the first-conductive-layer corner part 110c of the first conductive layer 110 and the corner part 120c of the second conductive layer 120, and the first-conductive-layer-side insulating layer 141 and the second-conductive-layer-side insulating layer 142 are provided. Thereby, the filament F1 is formed in high accuracy in a portion of the resistance change layer 130 in contact with the first-conductive-layer corner part 110c and a portion of the resistance change layers 130 in contact with the corner part 120c, and the controllability can be improved.

In other words, according to the nonvolatile memory device 202d, a forming voltage to form the filament F1 can be reduced, and the variation in the operating characteristics can be improved by making the states of the filament F1 uniform.

For the first conductive layer 110 and the second conductive layer 120, for example, TiN can be used. For the first-conductive-layer-side insulating layer 141 and the second-conductive-layer-side insulating layer 142, for example, TiO can be used. For the resistance change layer 130, HfO can be used. In such a configuration, the filament F1 is formed in the resistance change layer 130, that is, the filament F1 is formed in HfO having an insulating property higher than that of TiO. For this reason, the resistance of the reset state (a high resistance state) is large. As a result, the difference in the resistance value between the ON state and the OFF state (it may be a ratio of the resistance value) of the nonvolatile memory device 202d becomes large. Thereby, the operation margin of the nonvolatile memory device 202d is large.

In the nonvolatile memory device 202d, an insulating layer (the first-conductive-layer-side insulating layer 141 and the second-conductive-layer-side insulating layer 142) is not provided between the first major surface 110f and the resistance change layer 130 and between the third major surface 120f and the resistance change layer 130. For this reason, even in the case where the insulating properties of the first-conductive-layer-side insulating layer 141 and the insulating properties of the second-conductive-layer-side insulating layer 142 are low, the set voltage (a voltage applied in order to shift from a high resistance state to a low resistance state) is large and the operation margin is large because especially the first-conductive-layer-side insulating layer 141, which is a conductive layer of the cathode side, is not provided between the resistance change layer 130 and the first major surface 110 of the first conductive layer 110.

Since the area of the second major surface 110m of the first conductive layer 110 facing the rectifying element 70 is larger than the area of the third major surface 120f (and the first major surface 110f) inside the corner part 120c (and first-conductive-layer corner part 110c) serving as the electric field concentration part, a current can be efficiently passed between the first conductive layer 110 and the rectifying element 70. In other words, in this case as well, a stable operation is possible by controlling the filament F1 by the linear electric field concentration part of the corner part 120c of the second conductive layer 120 and the effect of efficient application of a current to the rectifying element 70.

An example of a method for manufacturing the nonvolatile memory device 202d will now be described.

Figure 14A:
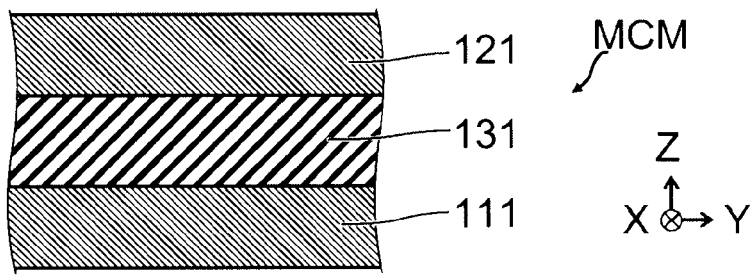
FIG. 14A to FIG. 14C are schematic cross-sectional views of processes, illustrating a method for manufacturing the nonvolatile memory device according to the second embodiment.
Figure 14B:
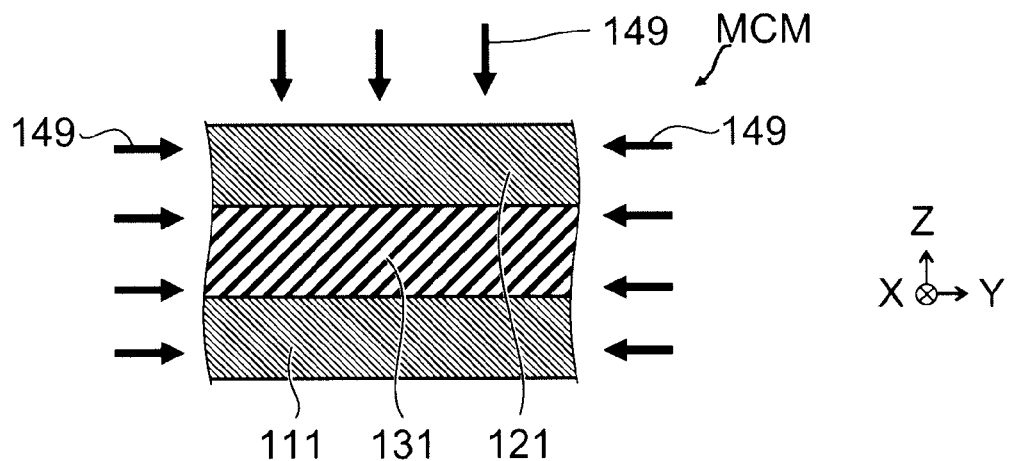
Figure 14C:
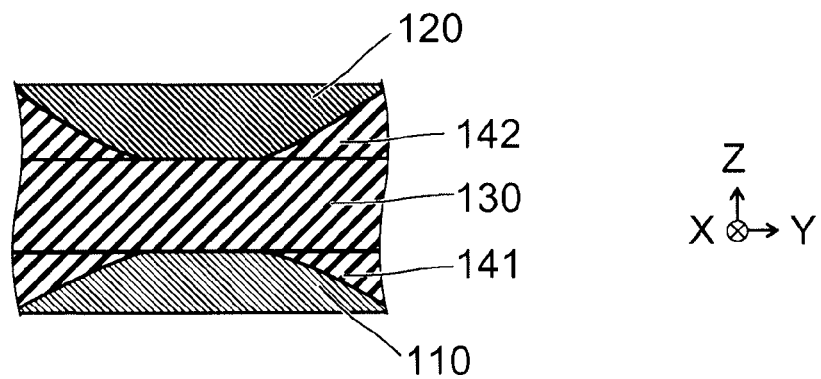

FIG. 14A to FIG. 14C are schematic cross-sectional views of processes, illustrating the method for manufacturing the nonvolatile memory device according to the second embodiment.

Hereinbelow, a method for manufacturing the memory layer 60 will be described.

First, as illustrated in FIG. 14A, for example, a TiN film is formed on a substrate, which is not illustrated, as a first conductive film 111 serving as the first conductive layer 110. The thickness of the first conductive film 111 can be set to be, for example, 20 nm. For example, a sputtering method can be used for film-forming of the first conductive film 111.

On the first conductive film 111, for example, a HfO film is formed as a resistance change film 131 serving as the resistance change layer 130. The thickness of the resistance change film 131 can be set to be, for example, 10 nm. For example, the sputtering method can be used for film-forming of the resistance change film 131.

On the resistance change film 131, for example, a TiN film is formed as the second conductive film 121 serving as the second conductive layer 120. The thickness of the second conductive film 121 can be set to be, for example, 20 nm. For example, the sputtering method can be used for film-forming of the second conductive film 121.

Then, a silicon nitride film as a mask material for processing is formed on the second conductive film 121. After the mask material is processed by the RIE method using a resist mask, an etching processing of the second conductive film 121, the resistance change film 131 and the first conductive film 111 is performed sequentially by using the mask material as a mask. Then, the mask material is removed by wet processing, and the structure of a memory cell base body MCM is formed. The width (for example, a length of one side) of the memory cell base body MCM is set to be, for example, 30 nm.

Then, as illustrated in FIG. 14B, oxygen radical 149 is generated in an oxygen atmosphere diluted with rare gas by microwave, and a radical oxidation treatment is performed on the memory cell base body MCM as an oxidation treatment. The temperature at this time is set to be, for example, 300° C., and the processing time is set to be, for example, 1 minute. Thereby, a side wall part of the memory cell base body MCM is oxidized. In other words, the oxidation treatment of the memory cell base body MCM is preformed to oxidize the second conductive film 121 (and the first conductive film 111) from the side wall of the memory cell base body MCM.

Specifically, for example, the oxygen radical 149, i.e., an oxidizer, diffuses in the resistance change film 131 and oxidizes the first conductive film 111 and the second conductive film 121 on a side of an interface with the resistance change film 131. And, TiO is formed from oxidized TiN of the first conductive film 111 and the second conductive film 121.

Portions of the TiO, which are oxidized, serve as the first-conductive-layer-side insulating layer 141 and the second-conductive-layer-side insulating layer 142.

Here, the diffusion length of the oxygen radical 149 in a metal oxide is comparatively short. Although the first conductive film 111 and the second conductive film 121 in the peripheral part region of the memory cell base body MCM are oxidized, those in the central part region are not oxidized. Thus, the first-conductive-layer-side insulating layer 141 and the second-conductive-layer-side insulating layer 142 are not formed in the central part of the memory cell base body MCM.

In other words, the first-conductive-layer-side insulating layer 141 and the second-conductive-layer-side insulating layer 142 are formed in regions from the periphery of the first conductive film 111 and the periphery of the second conductive film 121 to, for example, an about 5 nm inner side.

Thereby, as illustrated in FIG. 14C, the first-conductive-layer-side insulating layer 141 and the second-conductive-layer-side insulating layer 142 are formed. In other words, in this specific example, a TiN film is used as the first conductive film 111 and the second conductive film 121, and the first-conductive-layer-side insulating layer 141 and the second-conductive-layer-side insulating layer 142 include TiO in which TiN is oxidized.

At this time, an oxidized region becomes narrow in the central part of the memory cell base body MCM as compared with the oxidized region in the peripheral part thereof. In other words, the thickness of the first-conductive-layer-side insulating layer 141 and the thickness of the second-conductive-layer-side insulating layer 142 (lengths along the Z-axis direction) become thin in the central part of the memory cell base body MCM as compared with those in the peripheral part thereof. And, a portion of the first conductive film 111, which is not oxidized, serves as the first conductive layer 110, and a portion of the second conductive film 121, which is not oxidized, serves as the second conductive layer 120. The first major surface 110$f$ smaller than the second major surface 110$m$ is formed in the first conductive layer 110, and the third major surface 120$f$ smaller than the fourth major surface 120$m$ is formed in the second conductive layer 120.

In this specific example, the width of the memory cell base body MCM is 30 nm. The first-conductive-layer-side insulating layer 141 and the second-conductive-layer-side insulating layer 142 are formed in regions from the peripheral of the first conductive film 111 and the peripheral of the second conductive film 121 to, for example, an about 5 nm inner side. The width of the first major surface 110$f$ and the width of the third major surface 120$f$ are set to be about 20 nm.

When the width of the memory cell MC is excessively large and, for example, the third major surface 120$f$ becomes excessively large, e.g., larger than 50 nm, the resistance of the filament F1 may become uneven, and a forming voltage may increase. Accordingly, it is preferable that the width of the memory cell is not less than 10 nm and not more than about 60 nm. Also, it is preferable that the temperature of the radical oxidation treatment is, for example, not less than 100° C. and not more than about 500° C. in order to suppress excessive oxidization of the side wall parts of the first conductive film 111 and the second conductive film 121, to suppress characteristic degradation of the rectifying element 70 and the peripheral devices due to heat stress, and the like In the manufacturing method described above, the radical oxidation treatment is used for the technique for the oxidation treatment from the side wall of the memory cell base body MCM. However, the embodiment is not limited thereto. Other oxidation treatments, such as a dry oxidation, a wet oxidation and the like may be used. In other words, the technique of the oxidation treatment is arbitrary as long as the suitable oxidation condition is set with respect to the width of the memory cell base body MCM and the first-conductive-layer-side insulating layer 141 and the second-conductive-layer-side insulating layer 142 can be formed.

In the above, TiN is used for the first conductive film 111 and the second conductive film 121, HfO is used for the resistance change film 131, and the sputtering method is used for film-forming of these films. However, other materials can be used for these films, and other techniques can be used for the method for film-forming.

For example, the first conductive film 111 (the first conductive layer 110) and the second conductive film 121 (the second conductive layer 120) can include at least one of nitride of metallic element of at least one of Ti, Ta, Al, Hf, Zr and W and carbide of metallic element of at least one of Ti, Ta, Al, Hf, Zr and W. The first conductive film 111 (the first conductive layer 110) and the second conductive film 121 (the second conductive layer 120) can include metal of at least one of Ru, Au, Pd and Pt. A compound of plural element system, such as TiAlN and TaAlN, can be used for the first conductive film 111 (the first conductive layer 110) and the second conductive film 121 (the second conductive layer 120).

For example, the resistance change film 131 (the resistance change layer 130) can include, for example, a transition metal oxide. A two element system oxide of $A_xO_y$ (A is a transition metal element), for example, can be used for the resistance change film 131 (the resistance change layer 130). A three element system oxide like $A_xB_yO_z$ (A and B are transition metal elements), for example, can be used for the resistance change film 131 (the resistance change layer 130).

In the case where the thickness of the first-conductive-layer-side insulating layer 141 and the thickness of the second-conductive-layer-side insulating layer 142 (lengths along the Z-axis direction) are thin in the central part of the memory cell base body MCM as compared with those in the peripheral part thereof, the effect described above is obtained.

In this specific example, the case is described where the material for the first conductive film 111 is the same as the material for the second conductive film 121, both of the first conductive film 111 and the second conductive film 121 are oxidized by the oxidation treatment, and the first-conductive-layer-side insulating layer 141 and the second-conductive-layer-side insulating layer 142 are formed. However, the material for the first conductive film 111 may be different from the material for the second conductive film 121.

For example, in the case where a material, which is difficult to be oxidized, is used for the first conductive film 111 and a material, which is easy to be oxidized, is used for the second conductive film 121, the second conductive film 121 is oxidized by the oxidation treatment and the second-conductive-layer-side insulating layer 142 is formed. However, the first conductive film 111 is not substantially oxidized and the first-conductive-layer-side insulating layer 141 is not substantially formed. In this case, the configurations of the nonvolatile memory devices 202a and 202c are formed.

Figure 15A:
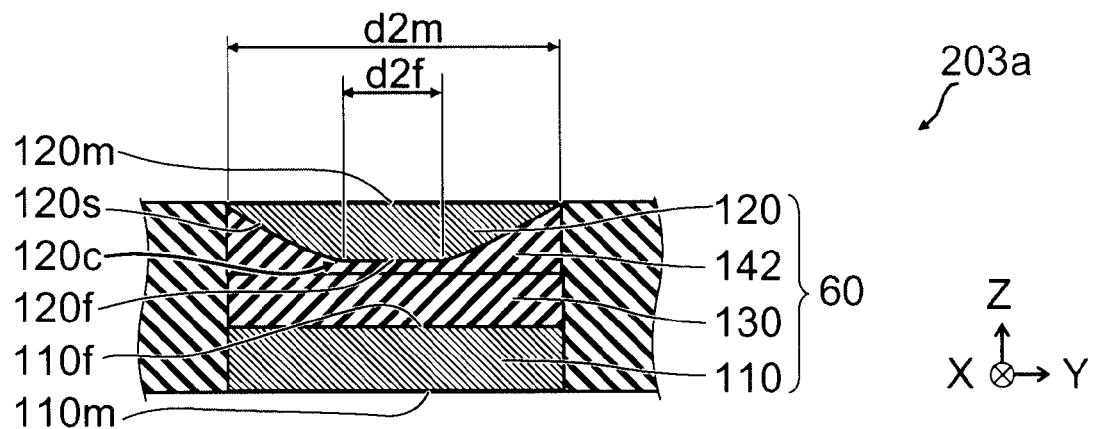
FIG. 15A and FIG. 15B are schematic cross-sectional views illustrating the configurations of other nonvolatile memory devices according to the second embodiment.
Figure 15B:
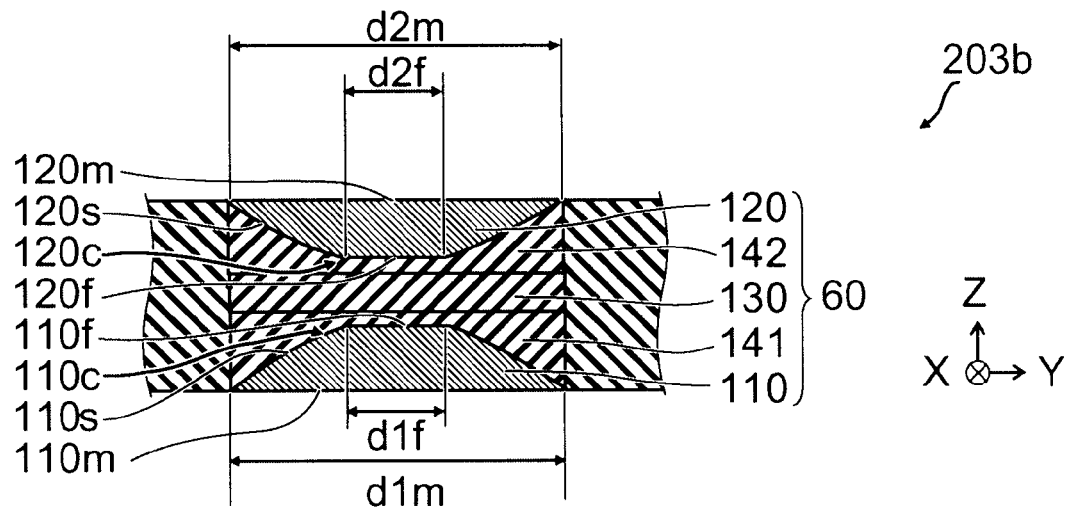

FIG. 15A and FIG. 15B are schematic cross-sectional views illustrating the configurations of other nonvolatile memory devices according to the second embodiment.

Namely, FIG. 15A and FIG. 15B are cross-sectional views corresponding to a part of line A-A' of FIG. 2A and illustrating the configurations of the nonvolatile memory devices 203a and 203b according to the embodiment, respectively.

As illustrated in FIG. 15A, in the nonvolatile memory device 203a, the second-conductive-layer-side insulating layer 142 extends also between the third major surface 120f of the second conductive layer 120 and the resistance change layer 130. Otherwise, the configuration of the nonvolatile memory device 203a is similar to that of the nonvolatile memory device 202a.

In this case as well, a linear electric field concentration part is formed in the corner part 120c of the second conductive layer 120, and the filament F1 is controlled and formed in a portion of the resistance change layers 130 proximal to the corner part 120c via the second-conductive-layer-side insulating layer 142 in contact with the corner part 120c. Thereby, an electric field is not concentrated excessively, the reliability is improved, and a stable operation can be realized.

As illustrated in FIG. 15B, in the nonvolatile memory device 203b, the second-conductive-layer-side insulating layer 142 extends also between the third major surface 120f of the second conductive layer 120 and the resistance change layer 130, and the first-conductive-layer-side insulating layer 141 extends also between the first major surface 110f of the first conductive layer 110 and the resistance change layer 130. Otherwise, the configuration of the nonvolatile memory device 203b is similar to that of the nonvolatile memory device 202b.

In this case as well, a linear electric field concentration part is formed in each of the corner part 120c of the second conductive layer 120 and the first-conductive-layer corner part 110c of the first conductive layer 110. And, the filament F1 is controlled and formed in the corner part 120c and the first-conductive-layer corner part 110c of the resistance change layers 130 via the second-conductive-layer-side insulating layer 142 in contact with the corner part 120c and the first-conductive-layer-side insulating layer 141 in contact with the first-conductive-layer corner part 110c. Thereby, an electric field is not concentrated excessively, the reliability is improved, and a stable operation can be realized.

Figure 16A:
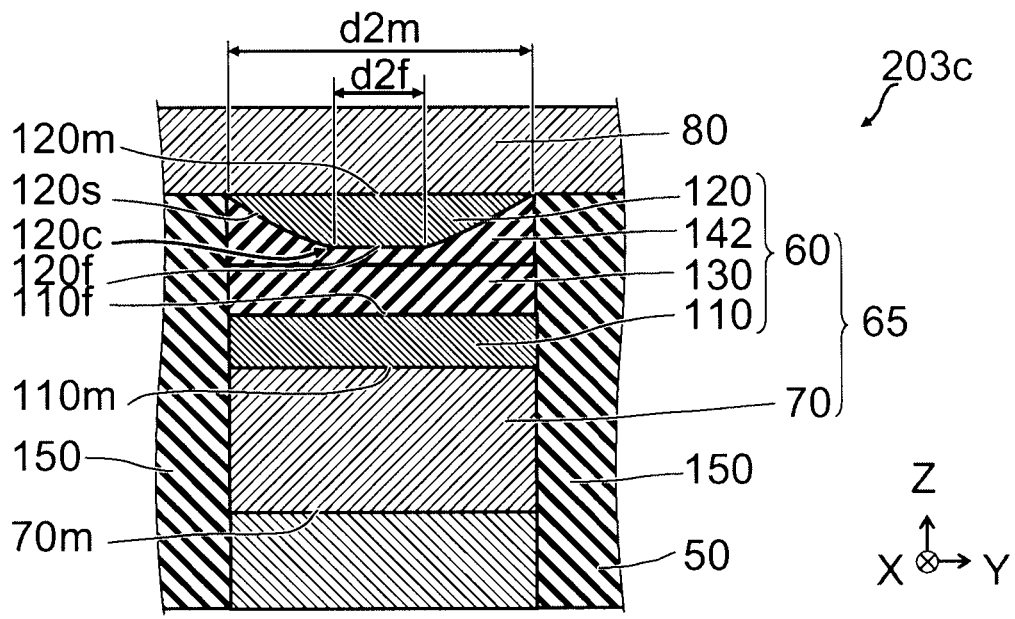
FIG. 16A and FIG. 16B are schematic cross-sectional views illustrating the configurations of other nonvolatile memory devices according to the second embodiment.
Figure 16B:
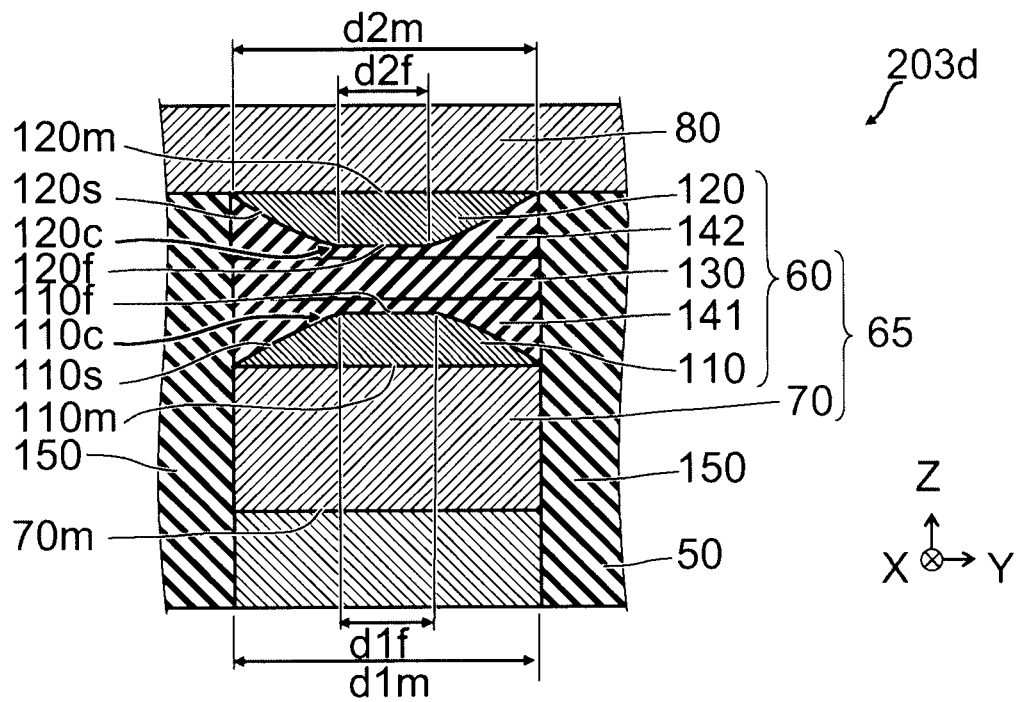

FIG. 16A and FIG. 16B are schematic cross-sectional views illustrating the configurations of other nonvolatile memory devices according to the second embodiment.

Namely, FIG. 16A and FIG. 16B are cross-sectional views corresponding to a part of line A-A' of FIG. 2A and illustrating the configurations of the nonvolatile memory devices 230c and 203d according to this embodiment, respectively.

As illustrated in FIG. 16A, in the nonvolatile memory device 203c, the second-conductive-layer-side insulating layer 142 extends also between the third major surface 120f of the second conductive layer 120 and the resistance change layer 130. Otherwise, the configuration of the nonvolatile memory device 203d is similar to that of the nonvolatile memory device 202c.

As illustrated in FIG. 16B, in the nonvolatile memory device 203d, the second-conductive-layer-side insulating layer 142 extends also between the third major surface 120f of the second conductive layer 120 and the resistance change layer 130, and the first-conductive-layer-side insulating layer 141 extends also between the first major surface 110f of the first conductive layer 110 and the resistance change layer 130. Otherwise, the configuration of the nonvolatile memory device 203d is similar to that of the nonvolatile memory device 202d.

In the nonvolatile memory device 203c and the nonvolatile memory device 203d as well, the same effects as the nonvolatile memory devices 203a and 203b can be obtained. And, in the nonvolatile memory device 203c and the nonvolatile memory device 230d, the area of the second major surface 110m of the first conductive layer 110 facing the rectifying element 70 is larger than the area of the third major surface 120f (and the first major surface 110f) inside the corner part 120c (and the first-conductive-layer corner part 110c) serving as an electric field concentration part. Therefore, a current can be efficiently passed between the first conductive layer 110 and the rectifying element 70. In other words, in this case as well, a stable operation can be performed by controlling the filament F1 by the linear electric field concentration part of the corner part 120c of the second conductive layer 120 and the effect of efficient application of a current to the rectifying element 70.

For example, the nonvolatile memory device 203d can be manufactured, for example, as follows.

That is, as described in regard to FIG. 14A, the first conductive film 111, the resistance change film 131, and the second conductive film 121 are formed, and these films are processed to form the memory cell base body MCM.

Then, a thermal oxidation treatment is performed on the memory cell base body MCM for 5 minutes under an oxygen atmosphere of 50 Torr at a temperature of 500° C. By this thermal oxidation treatment, oxygen is supplied into the resistance change film 131 from the side wall part of the memory cell base body MCM and further diffuses into the resistance change film 131. At this time, oxygen which diffuses in the resistance change film 131, i.e., a transition metal oxide is easy to be activated, and interface regions of the first conductive film 111 and the second conductive film 121 on the resistance change film 131 side are oxidized. Thereby, the first-conductive-layer-side insulating layer 141 and the second-conductive-layer-side insulating layer 142 are formed. In the thermal oxidation method, since a distance into which oxygen travels in the resistance change film 131 is comparatively long, the central parts of the first conductive film 111 and the second conductive film 121 are also oxidized. Thereby, the configuration illustrated in FIG. 16B is formed.

Also at this time, a region being oxidized becomes narrow in the central part of the memory cell base body MCM as compared with the peripheral part thereof. In other words, the thickness of the first-conductive-layer-side insulating layer 141 and the thickness of the second-conductive-layer-side insulating layer 142 (lengths along the Z-axis direction) become thin in the central part of the memory cell base body MCM as compared with those in the peripheral part thereof. A portion of the first conductive film 111, which is not oxidized, serves as the first conductive layer 110, and a portion of the second conductive film 121, which is not oxidized, serves as the second conductive layer 120. And, the first major surface 110f having an area smaller than the second major surface 110m is formed in the first conductive layer 110. The third major surface 120f having an area smaller than the fourth major surface 120m is formed in the second conductive layer 120.

If the temperature in the thermal oxidation treatment of the manufacturing method described above is high, oxygen becomes easy to diffuse into the resistance change film 131. Accordingly, it is possible to shorten the oxidation time. However, if the temperature is excessively high, the side wall parts of the first conductive film 111 and the second conductive film 121 may be oxidized excessively and the effective cell area may be decreased. Also, if the temperature is excessively high, the characteristic degradation of the rectifying element 70 and the peripheral devices due to heat stress may occur. For this reason, it is preferable that the temperature of the thermal oxidation treatment is, for example, not less than 400° C. and not more than about 600° C.

In the above, in the case where the width of the memory cell base body MCM is excessively large (in the case where the memory cell MC is excessively large), in the thermal oxidation treatment, oxygen may be difficult to reach to a region central part of the memory cell MC and the first-conductive-layer-side insulating layer 141 and the second-conductive-layer-side insulating layer 142 may not be formed properly. For this reason, it is preferable that the width of the memory cell base body MCM (the memory cell MC) is, for example, not less than 10 nm and not more than about 100 nm.

In the manufacturing method described above, the thermal oxidation method is used as the oxidation technique from the side wall of the memory cell base body MCM. However, other oxidation techniques, such as a wet oxidation, a radical oxidation and the like may be used. In other words, the oxidation technique is arbitrary as long as a suitable oxidation condition is set with respect to the width of the memory cell base body MCM and the first-conductive-layer-side insulating layer 141 and the second-conductive-layer-side insulating layer 142 can be formed.

In this case as well, the same materials as those described in regard to the nonvolatile memory device 202d can be used for the first conductive film 111, the second conductive film 121 and the resistance change film 131.

Third Embodiment

Figure 17A:
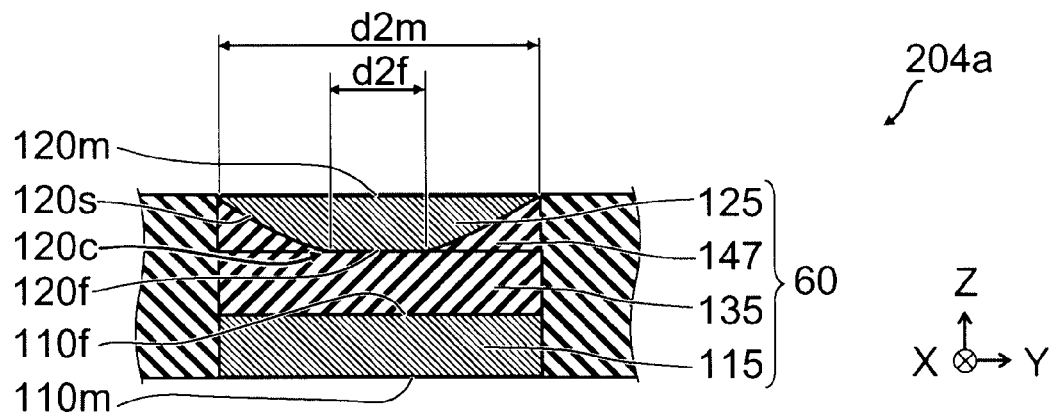
FIG. 17A and FIG. 17B are schematic cross-sectional views illustrating the configurations of nonvolatile memory devices according to a third embodiment.
Figure 17B:
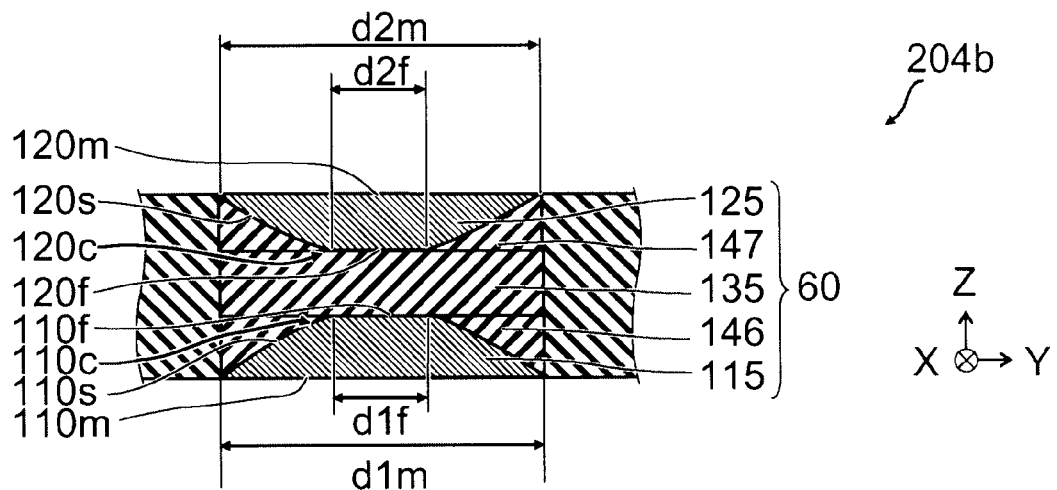

FIG. 17A and FIG. 17B are schematic cross-sectional views illustrating the configurations of nonvolatile memory devices according to a third embodiment.

Namely, FIG. 17A and FIG. 17B are cross-sectional views corresponding a part of line A-A' of FIG. 2A and illustrating the configurations of the nonvolatile memory devices 204a and 204b according to the embodiment, respectively.

As illustrated in FIG. 17A and FIG. 17B, although the nonvolatile memory devices 204a and 204b according to this embodiment have the same structures as those already described in the nonvolatile memory devices 202a and 202b, a special condition is provided in the relationship between the materials used for the first conductive layer 115 and the second conductive layer 125 and the material used for the resistance change layer 135 in the nonvolatile memory devices 204a and 204b. And, a special condition is provided in the relationship between the materials used for the first-conductive-layer-side insulating layer 146 and the second-conductive-layer-side insulating layer 147 and the material used for a resistance change layer 135.

Hereinbelow, the case is described where the first conductive layer 115 is the cathode and the second conductive layer 125 is the anode.

In the nonvolatile memory devices 204a and 204b, the second-conductive-layer-side insulating layer 147 provided between the side face 120s of the second conductive layer 125 on the anode side and the resistance change layer 130 includes a metal oxide, and the resistance change layer 130 also includes a metal oxide. And, the standard free energy of formation of an oxide of elements (especially metallic elements) other than oxygen included in the metal oxide included in the second-conductive-layer-side insulating layer 147 is lower than the standard free energy of formation of an oxide of elements (especially metallic elements) other than oxygen included in the metal oxide included in the resistance change layer 130. In other words, the metal oxide included in the second-conductive-layer-side insulating layer 147 is less stable than the metal oxide included in the resistance change layer 130.

In the case where the second-conductive-layer-side insulating layer 147 is formed by oxidation of a conductive material serving as the second conductive layer 125, the elements (especially metallic elements) other than oxygen included in the metal oxide included in the second-conductive-layer-side insulating layer 147 are elements (especially metallic elements) included in the second conductive layer 125. Accordingly, in the nonvolatile memory devices 204a and 204b, the standard free energy of formation of an oxide of elements (especially metallic elements) other than oxygen included in the second conductive layer 125 is lower than the standard free energy of formation of an oxide of elements (especially metallic elements) other than oxygen included in the metal oxide included in the resistance change layer 130. In other words, the metallic elements included in the second conductive layer 125 are metallic elements less stable than the metal oxide included in the resistance change layer 130 in the case of becoming oxide.

For example, in the case where HfO is used for the resistance change layer 130, the second conductive layer 120 includes metallic elements such as, for example, Ti, Ni, and Co, which are metallic elements forming an oxide with the standard free energy of formation of an oxide lower than that of HfO. In this case, the second-conductive-layer-side insulating layer 147 includes an oxide including metallic elements, such as Ti, Ni, and Co.

According to the nonvolatile memory devices 204a and 204b, the metal oxide included in the second-conductive-layer-side insulating layer 147 is less stable than the metal oxide included in the resistance change layer 130. Therefore, oxygen is easily to be supplied from the second-conductivelayer-side insulating layer 147 to the filament F1 formed in the resistance change layer 130 in the reset operation (a shift from a low resistance state to a high resistance state). As a result, a reset current can be reduced and a reset voltage can be also reduced. Thus, it is possible to shorten the reset operation time.

In the nonvolatile memory devices 204a and 204b as well, a linear electric field concentration part can be formed by providing the third major surface 120f, which is a plane, and the corner part 120c, which has a large curvature, in the second conductive layer 120. The state (a resistance value) of the filament F1 is made to be uniform, the forming operation in the low voltage is possible, and a stable operation is possible.

For the manufacturing methods of the nonvolatile memory devices 204a and 204b, the methods described in regard to FIG. 14A to FIG. 14C and modified methods thereof can be employed, for example. At this time, in the case of using HfO for the resistance change film 131 serving as the resistance change layer 130, a material including metallic elements such as, for example, Ti, Ni, and Co, which are metallic elements forming an oxide with the standard free energy of formation of an oxide lower than that of HfO, is used for the second conductive film 121 serving as the second conductive layer 125.

In the nonvolatile memory devices 204a and 204b, the same material as that for the second conductive layer 120 may be used for the first conductive layer 110, and a different material from that for the second conductive layer 120 may be used for the first conductive layer 110.

Figure 18A:
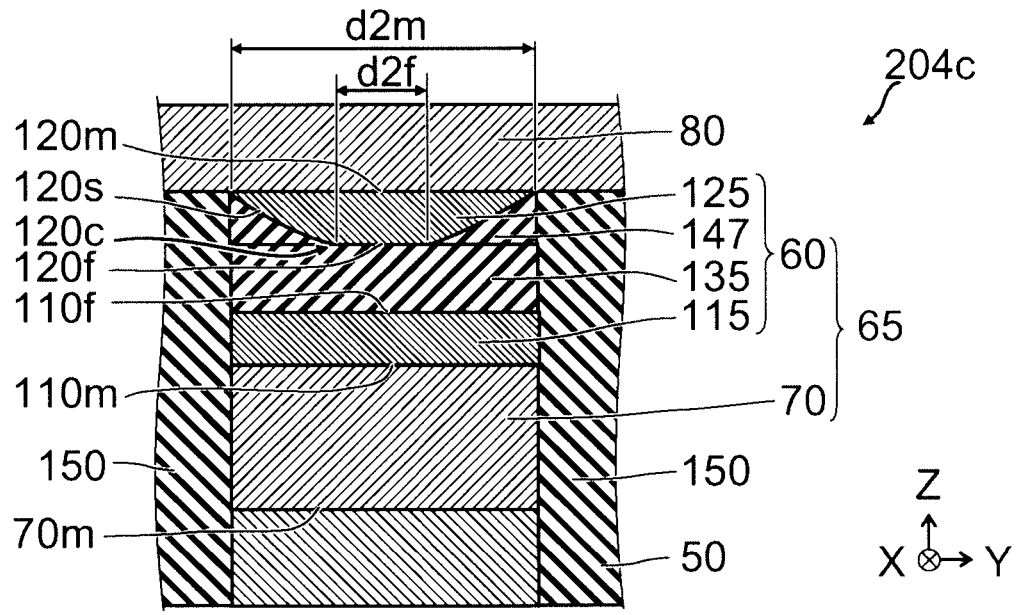
FIG. 18A and FIG. 18B are schematic cross-sectional views illustrating the configurations of other nonvolatile memory devices according to the third embodiment.
Figure 18B:
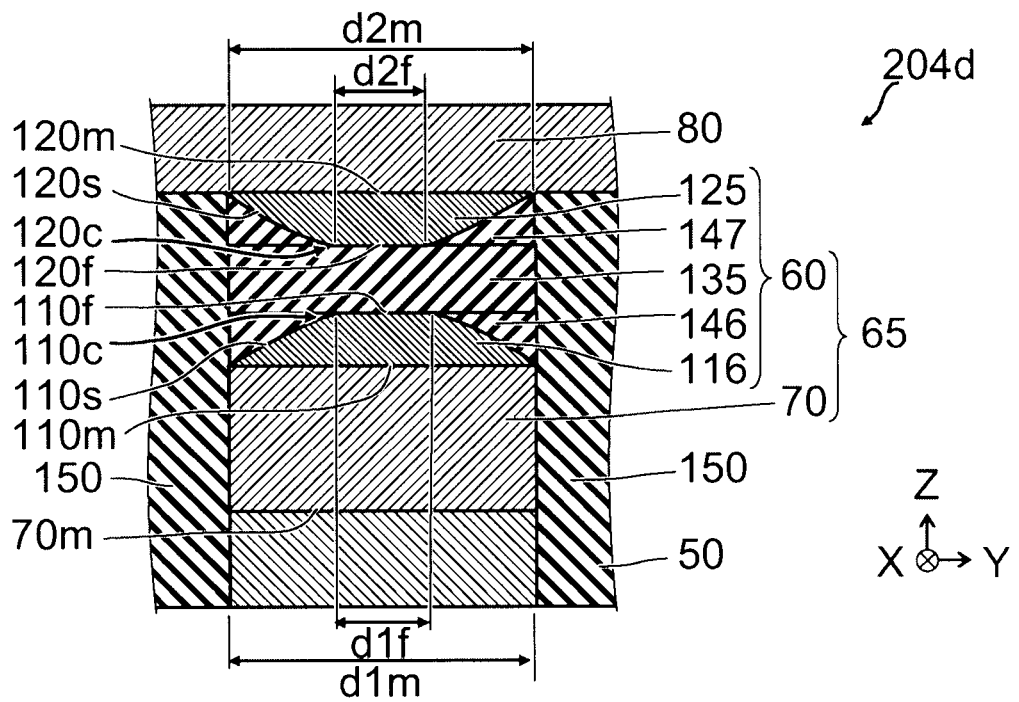

FIG. 18A and FIG. 18B are schematic cross-sectional views illustrating the configurations of other nonvolatile memory devices according to the third embodiment.

Namely, FIG. 18A and FIG. 18B are cross-sectional views corresponding to a part of line A-A' of FIG. 2A and illustrating the configurations of the nonvolatile memory devices 204c and 204e according to the embodiment, respectively.

As illustrated in FIG. 18A, in the other nonvolatile memory device 204c according to this embodiment, the rectifying element 70 is further provided on the first conductive layer 110 side in the nonvolatile memory device 204a described above.

As illustrated in FIG. 18B, in the other nonvolatile memory device 204e according to this embodiment, the rectifying element 70 is further provided on the first conductive layer 110 side in the nonvolatile memory device 204b described above.

In the nonvolatile memory devices 204c and 204d as well, similar to the nonvolatile memory devices 204a and 204b, a reset current can be reduced and a reset voltage can be also reduced. Thereby, it is possible to shorten the reset operation time. A stable operation is possible by controlling the filament F1 by a linear electric field concentration part of the corner part 120c of the second conductive layer 120 and the effect of efficient application of a current to the rectifying element 70.

In the nonvolatile memory devices 204a, 204b, 204c, and 204d described above, it is sufficient for the second conductive layer 125 to include an element with the standard free energy of formation of an oxide lower than the standard free energy of formation of an oxide of elements (especially metallic elements) other than oxygen included in the metal oxide included in the resistance change layer 130. For example, the second conductive layer 125 (for example, the second conductive film 121), may include mainly a metal with the standard free energy of formation of an oxide higher than the standard free energy of formation of an oxide of elements (especially metallic elements) other than oxygen included in the metal oxide included in the resistance change layer 130. Further, the second conductive layer 125 may be added with a metal with the standard free energy of formation of an oxide lower than the standard free energy of formation of an oxide of elements (especially metallic elements) other than oxygen included in the metal oxide included in the resistance change layer 130.

For example, in the case where the resistance change layer 130 includes HfO, a material in which at least one of, for example, Ti, Ni, and Co is added to any conductive material can be used for the second conductive layer 125.

For example, in the case where the resistance change layer 130 includes TiO, a material in which Ni is added to TiN can be used for the second conductive layer 125. In this case, the second-conductive-layer-side insulating layer 147 can include NiO. NiO is less stable than TiO as an oxide. Oxygen can be easily supplied to the filament F1 in TiO of the resistance change layer 130 from NiO of the second-conductive-layer-side insulating layer 147 in the reset. Accordingly, a reset current can be reduced and a reset voltage can be also reduced. Thereby, it is possible to shorten the reset operation time.

Figure 19A:
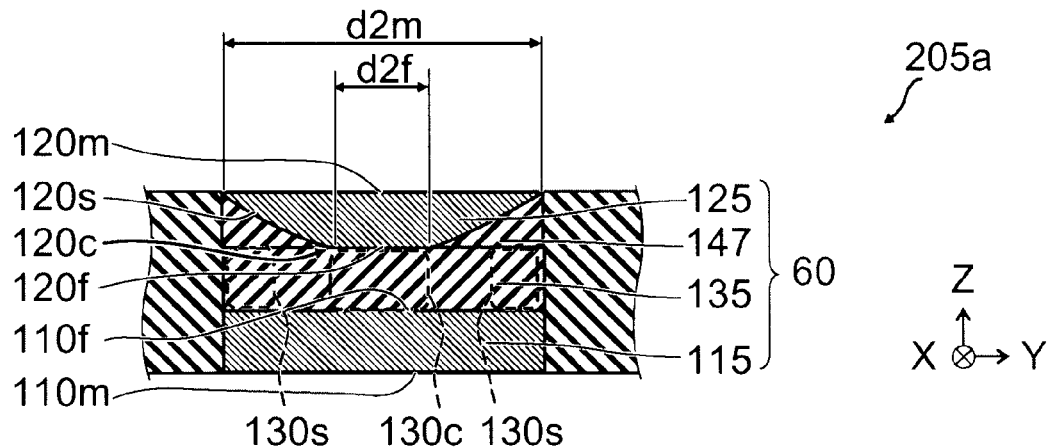
FIG. 19A and FIG. 19B are schematic cross-sectional views illustrating the configurations of other nonvolatile memory devices according to the third embodiment.
Figure 19B:
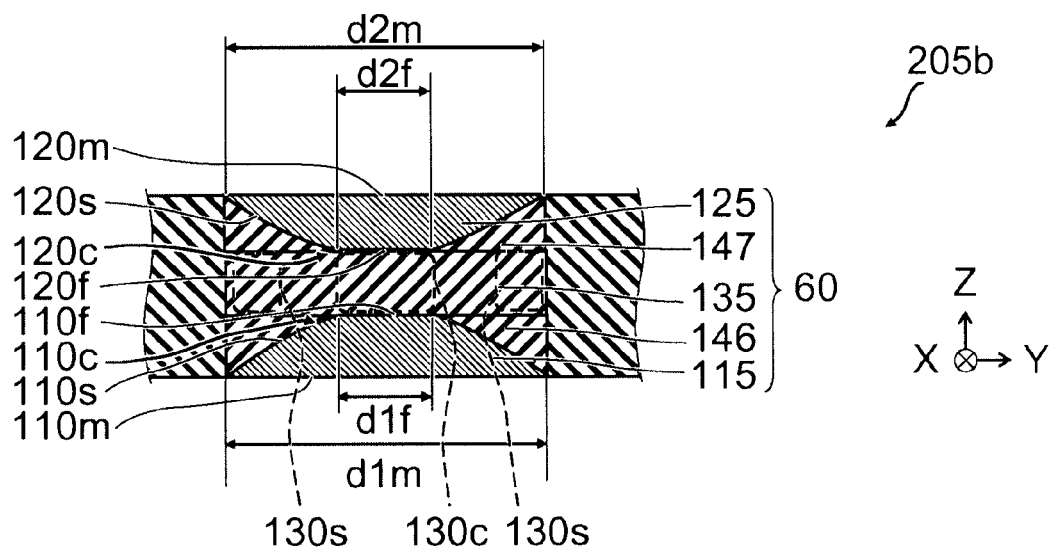

FIG. 19A and FIG. 19B are schematic cross-sectional views illustrating the configurations of other nonvolatile memory devices according to the third embodiment.

Namely, FIG. 19A and FIG. 19B are cross-sectional views corresponding to a part of line A-A' of FIG. 2A and illustrating the configurations of the nonvolatile memory devices 205a and 205b according to the embodiment, respectively.

In the other nonvolatile memory devices 205a and 205b according to this embodiment as illustrated in FIG. 19A and FIG. 19B, the characteristics are further changed is the central part and the peripheral part of the resistance change layer 130 of the nonvolatile memory devices 204a and 204b, respectively. Otherwise, the configurations of the nonvolatile memory devices 205a and 205b are similar to those of the nonvolatile memory devices 204a and 204b; therefore, the description thereof is omitted.

In the nonvolatile memory devices 205a and 205b, the central part 130c of the resistance change layer 130 (a central portion when cutting the resistance change layer 130 in the X-Y plane perpendicular to the Z-axis direction, i.e., the stacking direction from the first conductive layer 115 toward the second conductive layer 125) includes, for example, HfON, while the peripheral part 130s of the resistance change layer 130 (a portion outside the central part) includes, for example, HfO.

In other words, it is difficult for an oxidizer to diffuse in the central part 130c of the resistance change layer 130 as compared with the peripheral parts 130s of the resistance change layer 130. Thereby, in the oxidation treatment described in regard to FIG. 14B, the controllability of the penetration distance of an oxidizer from the side wall of the memory cell base body MCM can be enhanced.

In other words, by performing the oxidation treatment from the side wall of the memory cell base body MCM while using such a configuration, the penetration distance of an oxidizer from the side wall can be controlled with a high accuracy. By a heat treatment after the oxidation treatment (this heat treatment may be included in the oxidation treatment), the oxidizer which penetrated in the resistance change layer 130 diffuses toward the first conductive film 111 side and the second conductive film 121 side. Then, the first conductive film 111 and the second conductive film 121 are oxidized, and the first-conductive-layer-side insulating layer 146 and the second-conductive-layer-side insulating layer 147 are formed.

Thereby, the shape of the first-conductive-layer-side insulating layer 146 and the shape of the second-conductive-layer-side insulating layer 147 become to be easily controlled. At the same time, the shape of the first conductive layer 115 and the shape of the second conductive layer 125 become to be easily controlled. As a result, a stable operation can be realized.

In the above, the element included in the central part 130c of the resistance change layer 130 is made to be different from the element included in the peripheral part 130s of the resistance change layer 130. However, the configuration is arbitrary as long as an oxidizer is hard to diffuse in the central part 130c of the resistance change layer 130 as compared with the peripheral part 130s.

For example, a configuration in which the degree of crystallinity in the central part 130c of the resistance change layer 130 is higher than that in the peripheral part 130s can be employed. For example, HfO with high crystallinity may be used for the central part 130c of the resistance change layer 130 and amorphous HfO with low crystallinity may be used for the peripheral part 130s of the resistance change layer 130, for example.

The configuration (a configuration in which an oxidizer is difficult to diffuse in the central part 130c of the resistance change layer 130 as compared with the peripheral part 130s of the resistance change layer 130) described above is applicable also to any of the nonvolatile memory devices according to the second and third embodiments. Thereby, the controllability of the penetration distance of an oxidizer is enhanced. As a result, a stable operation can be realized.

Fourth Embodiment

A fourth embodiment is a method for manufacturing the nonvolatile memory devices according to the second and third embodiments, i.e., a nonvolatile memory device which has the second-conductive-layer-side insulating layer 142 (or the second-conductive-layer-side insulating layer 147).

In other words, the manufacturing method according to this embodiment is a method for manufacturing a nonvolatile memory device, which includes a first conductive layer, a second conductive layer, a resistance change layer, and a second-conductive-layer-side insulating layer. The first conductive layer has a first major surface and a second major surface. The second major surface is on a side opposite to the first major surface. The second conductive layer has a third major surface, a fourth major surface, a side face, and a corner part. The third major surface faces the first major surface and includes a plane parallel to the first major face. The fourth major surface is provided on a side of the third major surface opposite to the first major surface and has an area larger than the area of the third major surface. The side face is connected with the third major surface and the fourth major surface. The corner part is provided between the third major surface and the side face and has a curvature higher than that of the third major surface. The resistance change layer is provided between the first conductive layer and the second conductive layer. The resistance of the resistance change layer is configured to change by at least one of an electric field applied to the resistance change layer and a current applied to the resistance change layer. The second-conductive-layer-side insulating layer is sandwiched with the side face and the resistance change layer. Hereinafter, a method for forming the second-conductive-layer-side insulating layer 142 (or second-conductive-layer-side insulating layer 147), which is a part of the manufacturing method according to this embodiment will now be described.

Figure 20:
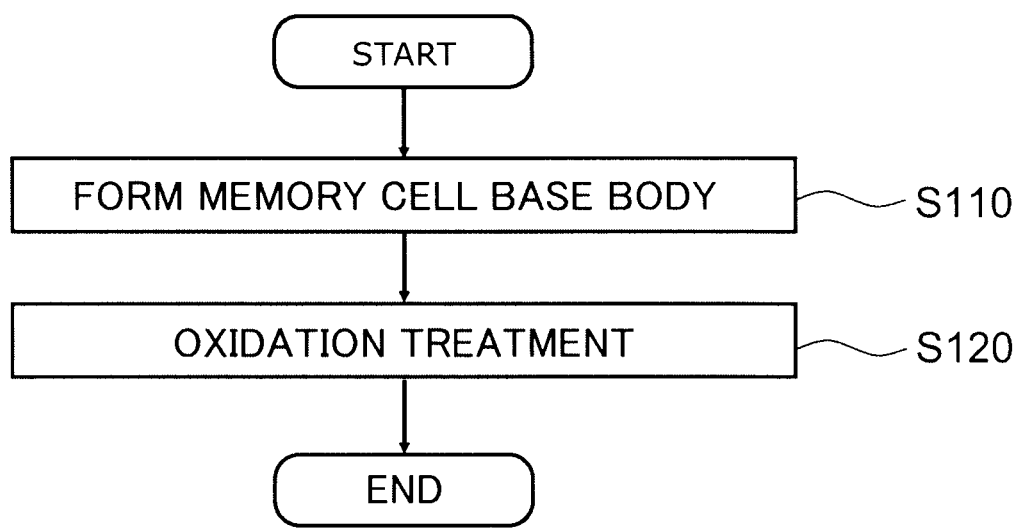
FIG. 20 is a flowchart illustrating a method for manufacturing a nonvolatile memory device according to a fourth embodiment.

FIG. 20 is a flowchart illustrating the method for manufacturing the nonvolatile memory device according to the fourth embodiment.

As illustrated in FIG. 20, a stacked film is formed by stacking the first conductive film 111 serving as the first conductive layer 110, the resistance change film 131 serving as the resistance change layer 130, and the second conductive film 121 serving as the second conductive layer 120. The stacked film is processed to form the memory cell base body MCM (Step S110). In other words, the method described in regard to FIG. 14A is implemented, for example.

Then, the second conductive film 121 is oxidized from the side wall of the memory cell base body MCM, and the second-conductive-layer-side insulating layer 142 (or the second-conductive-layer-side insulating layer 147) is formed (Step S120). In other words, the method described in regard to FIG. 14 B is implemented, for example.

As described above, any techniques, such as a radical oxidation, a dry oxidation, a wet oxidation, and a thermal oxidation are employed.

Thereby, the shape of the third major surface 120f and the shape of the fourth major surface 120m, which is larger than the third major surface 120f, can be formed in the second conductive layer 120 with good controllability and a comparatively easy way. According to the manufacturing method according to this embodiment, a nonvolatile memory device, which allows a stable operation, can be manufactured with high productivity.

In the above, the case is described where the nonvolatile memory devices according to the embodiment are crossing-point type nonvolatile memory devices. However, the embodiment is not limited thereto. For example, it is applicable also to a nonvolatile memory device in which the resistance change layer is used for a part of an MIS transistor.

For example, the nonvolatile memory device may further include the memory layer 60 of the nonvolatile memory device according to the first to third embodiments and an MIS (Metal Insulator Semiconductor) transistor including a gate electrode and a gate insulating layer which sandwich the memory layer 60. At least any of application of a voltage to the resistance change layer 130 of the memory layer 60 and application of a current to the resistance change layer 130 may be performed via the gate electrode.

In other words, the nonvolatile memory device further includes a first and second semiconductor regions of a second conductivity type provided in a first conductivity type semiconductor substrate; a first conductivity type semiconductor region between the first and second semiconductor regions of the second conductivity type; and a gate electrode configured to control a conduction and a non-conduction between the first and second semiconductor regions of the second conductivity type. Any of the memory layers 60 (including the first conductive layers 110, the second conductive layers 120, and the resistance change layers 130) of the nonvolatile memory devices according to the first to third embodiments is disposed between the gate electrode and the first conductivity semiconductor region. At least any of application of a voltage to the resistance change layer 130 of the nonvolatile memory device and application of a current to the resistance change layer 130 is performed via the gate electrode.

Thereby, the MIS transistor using the resistance change characteristic of the resistance change layer 130 can be used as a memory cell.

Thus, in the nonvolatile memory devices according to this embodiment, various kinds of modification are possible.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments are not limited to these specific examples. For example, one skilled in the art may similarly practice the invention by appropriately selecting specific configurations of components included in nonvolatile memory devices such as first conductive layers, second conductive layers, resistance change layers, rectifying elements, interconnects, and the like from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all nonvolatile memory devices and methods for manufacturing the same practicable by an appropriate design modification by one skilled in the art based on the nonvolatile memory devices and the methods for manufacturing the same described above as embodiments of the invention also are within the scope of the invention to the extent that the purport of the invention is included.

Furthermore, various modifications and alterations within the spirit of the invention will be readily apparent to those skilled in the art. All such modifications and alterations should therefore be seen as within the scope of the invention. For example, additions, deletions, or design modifications of components or additions, omissions, or condition modifications of processes appropriately made by one skilled in the art in regard to the exemplary embodiments described above are within the scope of the invention to the extent that the purport of the invention is included.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

The invention claimed is:

1. A nonvolatile memory device, comprising:
    a first conductive layer having:
        a first major surface; and
        a second major surface on a side opposite to the first major surface;
    a second conductive layer having:
        a third major surface facing the first major surface and including a plane parallel to the first major surface;
        a fourth major surface, the third major surface being provided between the fourth major surface and the first major surface;
        a side face connected with the third major surface and the fourth major surface; and
        a corner part provided between the third major surface and the side face, the corner part having a curvature higher than a curvature of the third major surface;
    a resistance change layer provided between the first conductive layer and the second conductive layer, a resistance of the resistance change layer being configured to change by at least one of an electric field applied to the resistance change layer and a current applied to the resistance change layer; and
    a rectifying element provided to face the second major surface of the first conductive layer,
    an area of the third major surface being smaller than an area of the second major surface,
    wherein an area of the first major surface is smaller than the area of the second major surface.

2. The device according to claim 1, wherein the area of the third major surface is smaller than an area of the fourth major surface and the side face is in contact with the resistance change layer.

3. The device according to claim 1, wherein the curvature of the corner part is higher than a curvature of the side face.

4. The device according to claim 1, wherein the third major surface, the corner part and the side face are covered with the resistance change layer.

5. The device according to claim 1, wherein an area of the fourth major surface is smaller than the area of the second major surface.

6. The device according to claim 1, wherein the first conductive layer is a cathode and the second conductive layer is an anode.

7. The device according to claim 1, wherein the area of the second major surface is not more than an area of a face of the rectifying layer on a side of the first conductive layer.

8. The device according to claim 1, further comprising:
    a first interconnect extending in a second direction perpendicular to a first direction from the rectifying element toward the first conductive layer; and
    a second interconnect extending in a third direction, the third direction being perpendicular to the first direction and intersecting with the second direction,
    the first conductive layer, the second conductive layer, the resistance change layer, and the rectifying element are disposed between the first interconnect and the second interconnect.

9. The device according to claim 1, further comprising a substrate,
    a direction from the first conductive layer toward the second conductive layer being parallel to a major surface of the substrate.

10. A nonvolatile memory device, comprising:
    a first conductive layer having:
        a first major surface; and
        a second major surface on a side opposite to the first major surface;
    a second conductive layer having:
        a third major surface facing the first major surface and including a plane parallel to the first major face;
        a fourth major surface having an area larger than an area of the third major surface, the third major surface being provided between the fourth major surface and the first major surface;
        a side face connected with the third major surface and the fourth major surface; and
        a corner part provided between the third major surface and the side face, the corner part having a curvature higher than a curvature of the third major surface;
    a resistance change layer provided between the first conductive layer and the second conductive layer, a resistance of the resistance change layer being configured to change by at least one of an electric field applied to the resistance change layer and a current applied to the resistance change layer; and a second-conductive-layer-side insulating layer sandwiched with the side face and the resistance change layer, the second-conductive-layer-side insulating layer including a metal oxide.

11. The device according to claim 10, wherein
the second conductive layer is an anode side,
the resistance change layer includes a metal oxide, and
a standard free energy of formation of an oxide of elements other than oxygen included in the metal oxide included in the second-conductive-layer-side insulating layer is lower than a standard free energy of formation of an oxide of elements other than oxygen included in the metal oxide included in the resistance change layer.

12. The device according to claim 10, wherein a thickness along a first direction of a part of the second-conductive-layer-side insulating layer contacting with a central part of the second conductive layer in a plane perpendicular to the first direction from the first conductive layer toward the second conductive layer is thinner than a thickness along the first direction of a part of the second-conductive-layer-side insulating layer contacting with a peripheral part outside of the second conductive layer in the plane.

13. The device according to claim 10, wherein the second-conductive-layer-side insulating layer is in contact with the side face and the resistance change layer is in contact with the third major surface.

14. The device according to claim 10, further comprising a first-conductive-layer-side insulating layer,
the first conductive layer further having a first-conductive-layer side face and a first-conductive-layer corner part,
the first-conductive-layer side face being connected with the first major surface and the second major surface,
the first-conductive-layer corner part being provided between the first major surface and the first-conductive-layer side face, a curvature of the first-conductive-layer corner part being higher than a curvature of the first major surface,
an area of the second major surface being larger than an area of the first major surface,
the first-conductive-layer-side insulating layer being sandwiched with the first-conductive-layer side face and the resistance change layer.

15. The device according to claim 10, further comprising a rectifying element,
the first conductive layer being disposed between the rectifying element and the resistance change layer.

16. The device according to claim 10, wherein
the resistance change layer includes HfO,
the second conductive layer includes at least one of Ti, Ni, and Co, and
the second-conductive-layer-side insulating layer includes an oxide of the at least one.

17. The device according to claim 10, wherein
the resistance change layer includes an oxide of Ti,
the second conductive layer includes Ni, and
the second-conductive-layer-side insulating layer includes an oxide of Ni.

\* \* \* \* \*